(12) United States Patent
Yang et al.

(10) Patent No.: US 12,495,571 B2
(45) Date of Patent: Dec. 9, 2025

(54) SEMICONDUCTOR DEVICE AND METHOD

(71) Applicant: Taiwan Semiconductor Manufacturing Co., Ltd., Hsinchu (TW)

(72) Inventors: Chih-Chuan Yang, Tainan (TW); Kuo-Hsiu Hsu, Zhongli (TW); Feng-Ming Chang, Zhubei (TW); Kian-Long Lim, Hsinchu (TW); Lien Jung Hung, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/654,766

(22) Filed: May 3, 2024

(65) Prior Publication Data

US 2024/0290886 A1 Aug. 29, 2024

Related U.S. Application Data

(63) Continuation of application No. 17/812,874, filed on Jul. 15, 2022, now Pat. No. 12,009,428, which is a (Continued)

(51) Int. Cl.
*H10D 30/62* (2025.01)
*H10D 30/01* (2025.01)
(Continued)

(52) U.S. Cl.
CPC ......... *H10D 30/62* (2025.01); *H10D 30/0243* (2025.01); *H10D 30/0245* (2025.01);
(Continued)

(58) Field of Classification Search
CPC .. H10D 30/62; H10D 30/0245; H10D 64/017; H10D 62/118; H10D 84/834; H10D 30/6219; H10D 62/83; H10D 30/0243
See application file for complete search history.

(56) References Cited

U.S. PATENT DOCUMENTS 9,209,247 B2 12/2015 Colinge et al.
9,236,267 B2 1/2016 De et al.
(Continued)

FOREIGN PATENT DOCUMENTS

CN 104979396 A 10/2015
CN 109686704 A 4/2019
(Continued)

OTHER PUBLICATIONS

Kumar, P. et al., "Analysis of Nanosheet Field Effect Transistor (NSFET) for Device and Circuit Perspective," IEEE 2019 Women Institute of Technology Conference on Electrical and Computer Engineering (WITCON ECE), 2019, 4 pages.

*Primary Examiner* — Christine A Enad
(74) *Attorney, Agent, or Firm* — Slater Matsil, LLP

(57) ABSTRACT

A semiconductor device including nanosheet field-effect transistors (NSFETs) in a first region and fin field-effect transistors (FinFETs) in a second region and methods of forming the same are disclosed. In an embodiment, a device includes a first memory cell, the first memory cell including a first transistor including a first channel region, the first channel region including a first plurality of semiconductor nanostructures; and a second transistor including a second channel region, the second channel region including a semiconductor fin.

20 Claims, 54 Drawing Sheets

Related U.S. Application Data continuation of application No. 16/785,247, filed on Feb. 7, 2020, now Pat. No. 11,444,197.

(51) Int. Cl.
*H10D 62/10* (2025.01)
*H10D 62/83* (2025.01)
*H10D 64/01* (2025.01)
*H10D 84/83* (2025.01)

(52) U.S. Cl.
CPC ....... *H10D 30/6219* (2025.01); *H10D 62/118* (2025.01); *H10D 62/83* (2025.01); *H10D 64/017* (2025.01); *H10D 84/834* (2025.01)

(56) References Cited

U.S. PATENT DOCUMENTS

| | | |
|---|---|---|
| 9,406,804 B2 | 8/2016 | Huang et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 10,157,987 B1* | 12/2018 | Liaw .................... H01L 23/5226 |
| 10,170,484 B1 | 1/2019 | Sung et al. |
| 11,444,197 B2 | 9/2022 | Yang et al. |
| 2015/0295089 A1 | 10/2015 | Huang et al. |
| 2017/0170331 A1 | 6/2017 | Liang et al. |
| 2019/0214473 A1 | 7/2019 | Xie et al. |
| 2019/0355724 A1 | 11/2019 | Chiang et al. |
| 2020/0058800 A1 | 2/2020 | Wang |
| 2020/0365602 A1* | 11/2020 | Yang ..................... H10D 89/10 |
| 2021/0020643 A1* | 1/2021 | Yang ................... H10D 30/6211 |
| 2021/0249530 A1 | 8/2021 | Yang et al. |

FOREIGN PATENT DOCUMENTS

| | | |
|---|---|---|
| CN | 110504215 A | 11/2019 |
| KR | 20170068689 A | 6/2017 |

* cited by examiner

SEMICONDUCTOR DEVICE AND METHOD

PRIORITY CLAIM AND CROSS-REFERENCE

This application is a continuation of U.S. patent application Ser. No. 17/812,874, filed on Jul. 15, 2022, and entitled "Semiconductor Device and Method," which is a continuation of U.S. patent application Ser. No. 16/785,247, filed on Feb. 7, 2020, entitled "Semiconductor Device and Method," now U.S. Pat. No. 11,444,197, issued on Sep. 13, 2022, which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF ILLUSTRATIVE EMBODIMENTS

Figure 1:
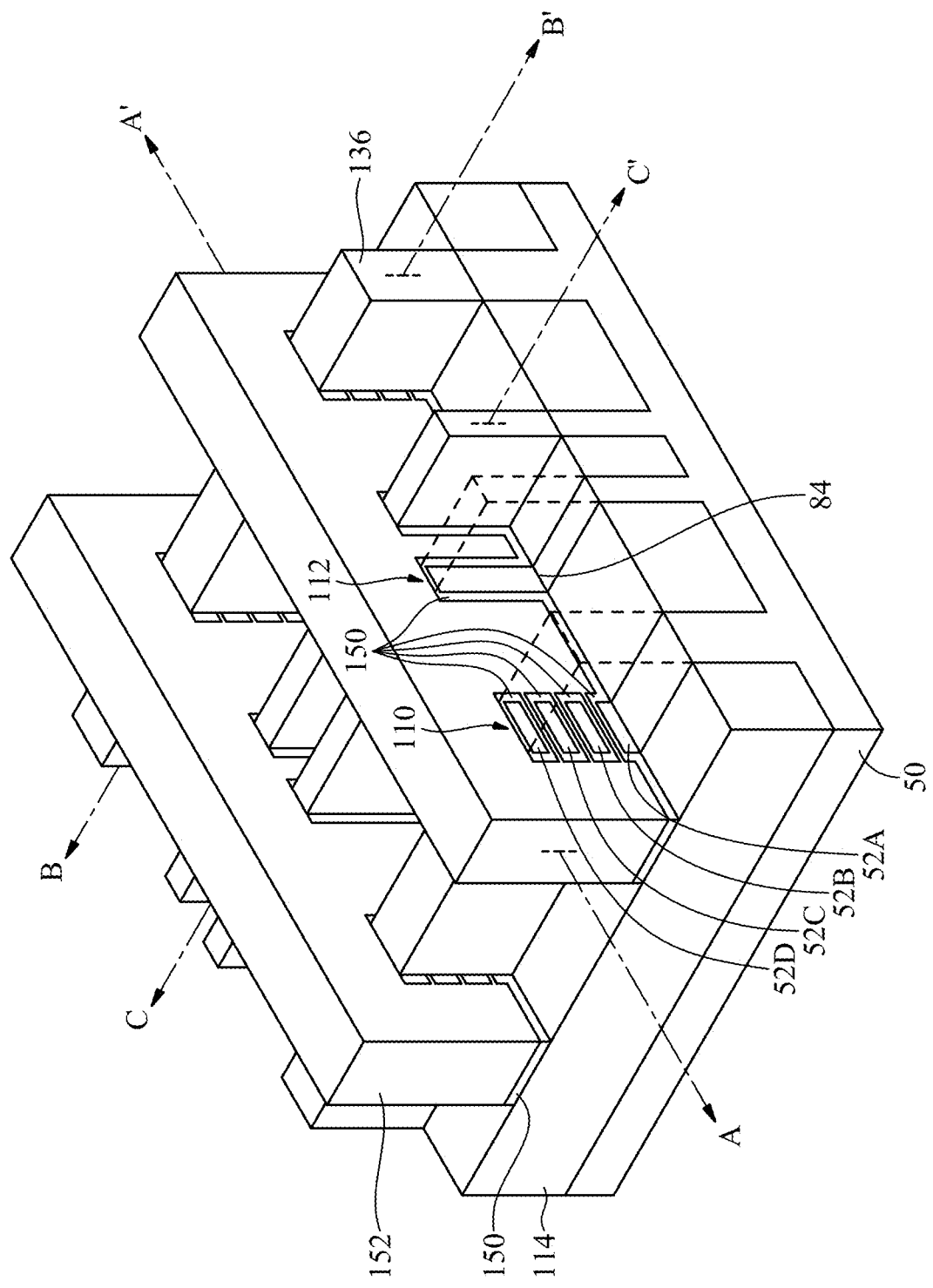
FIG. 1 illustrates an example of a semiconductor device including nanosheet field-effect transistors (NSFETs) and fin field-effect transistors (FinFETs) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide semiconductor devices including both nanostructure (e.g., nanosheet, nanowire, or the like) field-effect transistors (NSFETs) and fin field-effect transistors (FinFETs). NSFETs may be used to provide transistors having relatively high drive current, which increases performance and speed of the semiconductor devices. FinFETs may include fins having widths less than widths of nanostructures in the NSFETs and may be used to decrease cell size and provide transistors having relatively low drive current. The FinFETs may also have better N-well/P-well boundaries and may reduce leakage and latch-up issues. In some embodiments, the semiconductor devices may be static random access memory (SRAM) cells or the like. For SRAM cells, it may be desirable to use strong transistors in NMOS regions, which may include pull-down transistors and pass-gate transistors, and weak transistors in PMOS regions, which may include pull-up transistors. In various embodiments, the NSFETs may be formed in the NMOS regions of the SRAM cells and the FinFETs may be formed in the PMOS regions of the SRAM cells. Including both the NSFETs and the FinFETs results in faster SRAM operation, reduced cell size (in comparison the SRAM cells including NSFETs only), better cell current, smaller threshold voltage ($V_t$) mismatch, and lower minimum power supply voltage ($V_{ccmin}$).

FIG. 1 illustrates a three-dimensional view of an example of a semiconductor device including both NSFETs and FinFETs, in accordance with some embodiments. The NSFETs comprise nanostructures 110 on a substrate 50 (e.g., a semiconductor substrate). The nanostructures 110 include first semiconductor layers 52A-52D, which act as channel regions of the nanostructures 110. The FinFETs include fins 112 on the substrate 50. The fins 112 include a first epitaxial semiconductor material 84, which acts as a channel region of the fins 112. Isolation regions 114 are disposed in the substrate 50, and the nanostructures 110 and the fins 112 protrude above and from between neighboring isolation regions 114. Although the isolation regions 114 are described/illustrated as being separate from the substrate 50, as used herein, the term "substrate" may refer to the semiconductor substrate alone or a combination of the semiconductor substrate and the isolation regions. Additionally, although the nanostructures 110 and the fins 112 are illustrated as single, continuous materials with the substrate 50, the nanostructures 110, the fins 112, and/or the substrate 50 may comprise a single material or a plurality of materials. In this context, the nanostructures 110 and the fins 112 refer to the portions extending between the neighboring isolation regions 114.

Gate dielectric layers 150 are along top surfaces and sidewalls of the first semiconductor layer 52A and the first epitaxial semiconductor material 84 and along top surfaces, sidewalls, and bottom surfaces of the first semiconductor layers 52B-52D. Gate electrodes 152 are over the gate dielectric layers 150. Epitaxial source/drain regions 136 are disposed in opposite sides of the nanostructures 110 and the fins 112 with respect to the gate dielectric layers 150 and the gate electrodes 152. FIG. 1 further illustrates reference cross-sections that are used in later figures. Cross-section A-A' is along a longitudinal axis of a gate electrode 152 and in a direction, for example, perpendicular to the direction of current flow between the epitaxial source/drain regions 136 of the NSFETs/FinFETs. Cross-section B-B' is perpendicular to cross-section A-A' and is along a longitudinal axis of an nanostructures 110 in an NMOS region of an NSFET and in a direction of, for example, a current flow between the epitaxial source/drain regions 136 of the NSFET. Cross-section C-C' is parallel to cross-section B-B' and extends through a fin 112 in a PMOS region of a FinFET and in a direction of, for example, a current flow between the epitaxial source/drain regions 136 of the FinFET. Subsequent figures refer to these reference cross-sections for clarity.

Some embodiments discussed herein are discussed in the context of NSFETs/FinFETs formed using a gate-last process. In other embodiments, a gate-first process may be used. Also, some embodiments contemplate aspects used in planar devices, such as planar FETs.

FIGS. 2 through 27C are cross-sectional views of intermediate stages in the manufacturing of semiconductor devices including NSFETs and FinFETs, in accordance with some embodiments. FIGS. 2 through 14, 15A, 21A, 22A, 23A, 24A, 25A, 26A, and 27A illustrate reference cross-section A-A' illustrated in FIG. 1. FIGS. 15B, 16A, 17A, 18A, 19A, 20A, 21B, 22B, 23B, 24B, 25B, 26B, and 27B illustrate reference cross-section B-B' illustrated in FIG. 1. FIGS. 15C, 16B, 17B, 18B, 19B, 20B, 21C, 22C, 23C, 24C, 25C, 26C, and 27C illustrate reference cross-section C-C' illustrated in FIG. 1.

Figure 2:
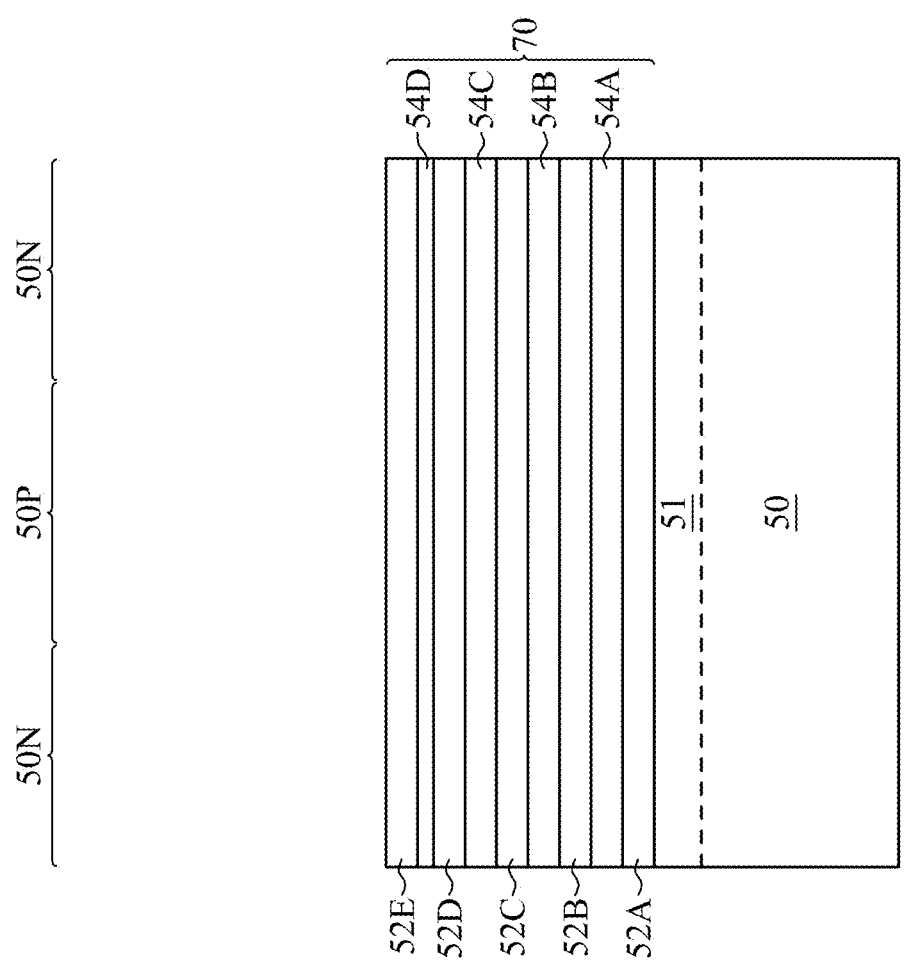
FIGS. 2, 3, 4, 5, 6, 7, 8, 9, 10, 11, 12, 13, 14, 15A, 15B, 15C, 16A, 16B, 17A, 17B, 18A, 18B, 19A, 19B, 20A, 20B, 21A, 21B, 21C, 22A, 22B, 22C, 23A, 23B, 23C, 24A, 24B, 24C, 25A, 25B, 25C, 26A, 26B, 26C, 27A, 27B, and 27C are cross-sectional views of intermediate stages in the manufacturing of semiconductor devices, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has regions 50N and a region 50P. The regions 50N can be for forming n-type devices, such as NMOS transistors, e.g., n-type NSFETs. The region 50P can be for forming p-type devices, such as PMOS transistors, e.g., p-type FinFETs. The region 50N may be physically separated from the region 50P (not separately illustrated), and any number of device features (e.g., other active devices, doped regions, isolation structures, etc.) may be disposed between the regions 50N and the region 50P. Although two regions 50N and one region 50P are illustrated, any number of regions 50N and regions 50P may be provided.

The substrate 50 may be lightly doped with a p-type or an n-type impurity. An anti-punch-through (APT) implantation may be performed on an upper portion of the substrate 50 to form an APT region 51. During the APT implantation, dopants may be implanted in the regions 50N and the region 50P. The dopants may have a conductivity type opposite a conductivity type of source/drain regions (such as the epitaxial source/drain regions 136, discussed below with respect to FIGS. 20A and 20B) to be formed in each of the regions 50N and the region 50P. The APT region 51 may extend under the subsequently formed source/drain regions in the resulting NSFETs/FinFETs, which will be formed in subsequent processes. The APT region 51 may be used to reduce the leakage from the source/drain regions to the substrate 50. In some embodiments, the doping concentration in APT region 51 may be from about $1 \times 10^{13}$ atoms/cm$^3$ to about $1 \times 10^{14}$ atoms/cm$^3$. For simplicity and legibility, the APT region 51 is not illustrated in subsequent drawings.

Further in FIG. 2, a multi-layer stack 70 is formed over the substrate 50. The multi-layer stack 70 includes alternating first semiconductor layers 52 and second semiconductor layers 54 of different semiconductor materials. The first semiconductor layers 52 may be formed of first semiconductor materials, which may include, for example, silicon (Si), silicon carbon (SiC), or the like. The second semiconductor layers 54 may be formed of second semiconductor materials, which may include, for example, silicon germanium (SiGe), a III-V compound semiconductor material (e.g., gallium arsenide (GaAs), indium phosphide (InP), gallium phosphide (GaP), gallium nitride (GaN), or the like), or the like. In other embodiments, the first semiconductor layers 52 may be formed of the second semiconductor materials and the second semiconductor layers 54 may be formed of the first semiconductor materials. For purposes of illustration, the multi-layer stack 70 includes five of the first semiconductor layers 52 (e.g., first semiconductor layers 52A-52E) and four of the second semiconductor layers 54 (e.g., second semiconductor layers 54A-54D). In other embodiments, the multi-layer stack 70 may include any number of the first semiconductor layers 52 and the second semiconductor layers 54. Each of the layers of the multi-layer stack 70 may be epitaxially grown using a process such as chemical vapor deposition (CVD), atomic layer deposition (ALD), vapor phase epitaxy (VPE), molecular beam epitaxy (MBE), or the like.

For purposes of illustration, the first semiconductor layers 52 will be described as forming channel regions in completed NSFET devices. The second semiconductor layers 54 may be sacrificial layers, which may be subsequently removed. Each of the first semiconductor layers 52A-52D may have a thickness from about 8 nm to about 10 nm, such as about 9 nm and each of the second semiconductor layers 54A-54C may have a thickness from about 6 nm to about 8 nm, such as about 7 nm. The first semiconductor layer 52E and the second semiconductor layer 54D may form etch stop layers or the like. The second semiconductor layer 54D may have a thickness from about 6 nm to about 7 nm, such as about 6.5 nm and the first semiconductor layer 52E may have a thickness from about 6 nm to about 7 nm, such as about 6.5 nm. Nevertheless, in some embodiments the second semiconductor layers 54A-54C may form channel regions in completed NSFET devices, while the first semiconductor layers 52A-52D may be sacrificial layers.

Figure 3:
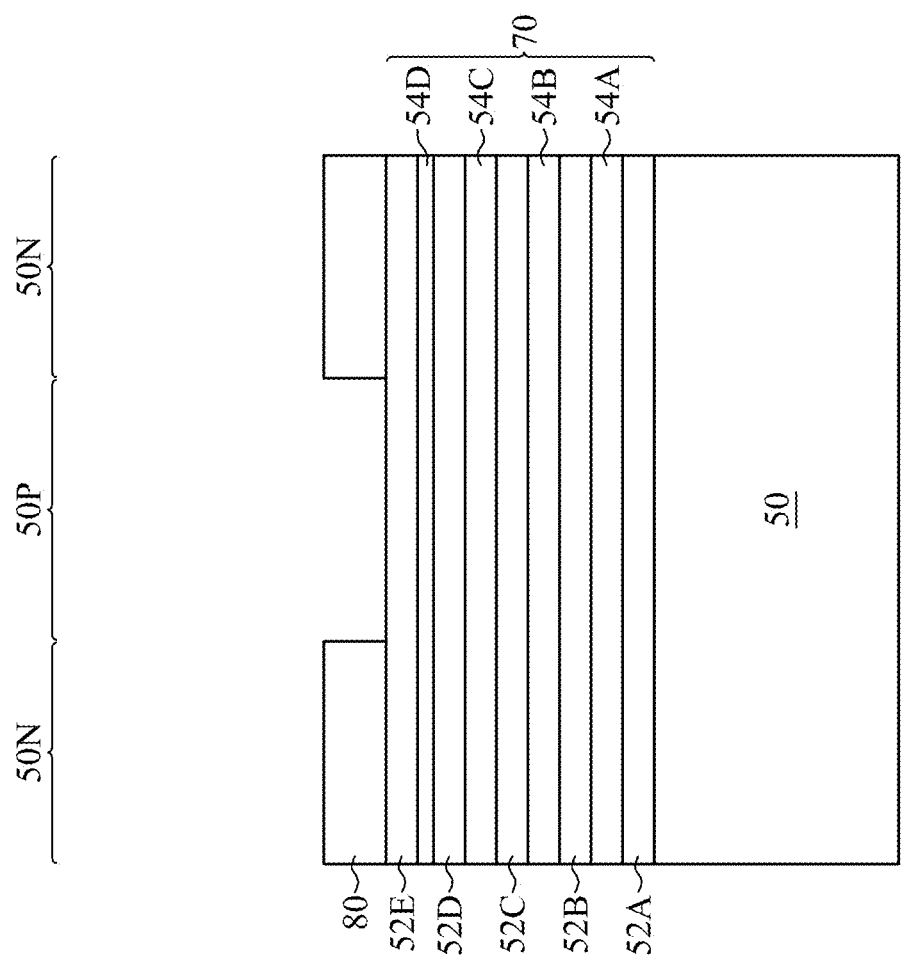

In FIG. 3, a patterned mask, such as a first patterned photoresist 80, is formed over the multi-layer stack 70. The first patterned photoresist 80 may be formed by depositing a photoresist layer over the multi-layer stack 70 using spin-on coating or the like. The photoresist layer may then be patterned by exposing the photoresist layer to a patterned energy source (e.g., a patterned light source) and developing the photoresist layer to remove an exposed or unexposed portion of the photoresist layer, thereby forming the first patterned photoresist 80. As illustrated in FIG. 3, the first patterned photoresist 80 may cover the regions 50N and an opening in the first patterned photoresist 80 may expose the region 50P.

Figure 4:
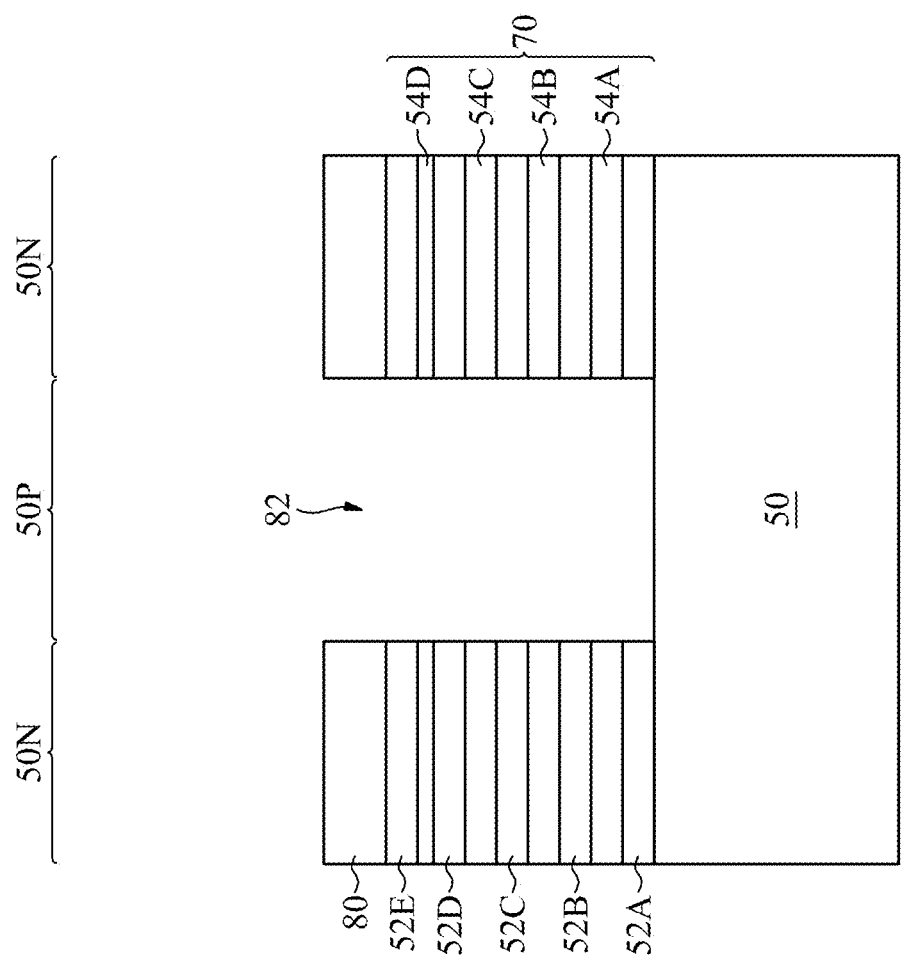

In FIG. 4, the multi-layer stack 70 in the region 50P is etched to form a first opening 82 in the multi-layer stack 70 using the first patterned photoresist 80 as a mask. The multi-layer stack 70 may be etched by a suitable etching process, such as reactive ion etching (RIE), neutral beam etching (NBE), the like, or a combination thereof. The etching process may be anisotropic. As illustrated in FIG. 4, each of the first semiconductor layers 52A-52E and each of the second semiconductor layers 54A-54D are etched in the region 50P to expose the substrate 50.

Figure 5:
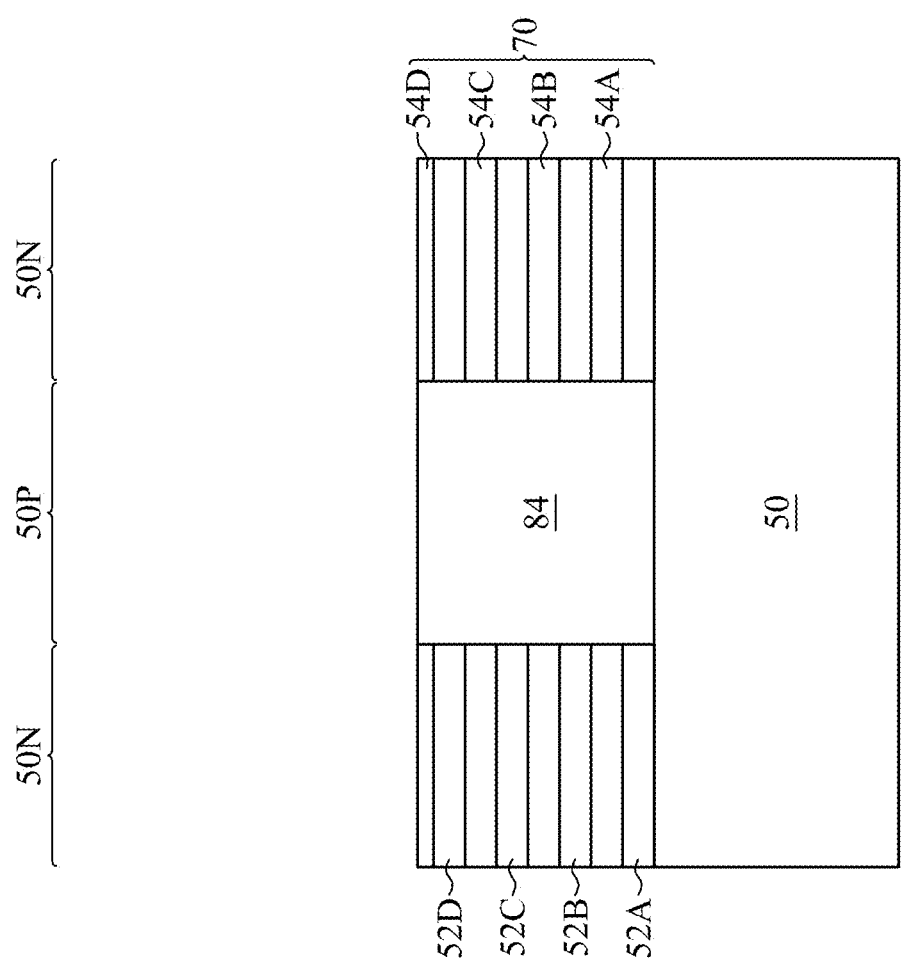

In FIG. 5, the first patterned photoresist 80 is removed and a first epitaxial semiconductor material 84 is formed filling the first opening 82. The first patterned photoresist 80 may be removed by any acceptable process, such as an ashing process, a stripping process, the like, or a combination thereof. The first epitaxial semiconductor material 84 may be deposited by an epitaxial growth process, such as CVD, ALD, VPE, MBE, or the like. The first epitaxial semiconductor material 84 may comprise a semiconductor material such as silicon, silicon carbide, silicon germanium, silicon phosphide, or the like, and may comprise the same material as or a different material from the semiconductor materials used to form the multi-layer stack 70.

In various embodiments, the first epitaxial semiconductor material 84 may be doped with n-type impurities, such as phosphorus, arsenic, antimony, or the like, or with p-type impurities, such as boron, boron fluoride, indium, or the like. The first epitaxial semiconductor material 84 may be in situ doped during growth or subsequent implantations may be used to dope the first epitaxial semiconductor material 84.

The first epitaxial semiconductor material 84 may be grown such that the first epitaxial semiconductor material 84 extends over top surfaces of the multi-layer stack 70. After the first epitaxial semiconductor material 84 is grown, the first epitaxial semiconductor material 84 and the multi-layer stack 70 may be planarized using an acceptable planarization process, such as chemical mechanical polishing (CMP), an etch-back process, the like, or a combination thereof. The planarization process may remove the first semiconductor layer 52E and may proceed until the second semiconductor layer 54D is exposed. As such, following the planarization process, top surfaces of the second semiconductor layer 54D may be level with a top surface of the first epitaxial semiconductor material 84, as illustrated in FIG. 5.

The process described with respect to FIGS. 2 through 5 is just one example of how the multi-layer stack 70 and the first epitaxial semiconductor material 84 may be formed. In some embodiments, a dielectric layer can be formed over a top surface of the substrate 50, and trenches can be etched through the dielectric layer to expose the underlying substrate 50. Epitaxial growth processes may be performed to epitaxially grow the multi-layer stack 70 in the trenches, and the dielectric layer can be removed such that the multi-layer stack 70 is formed over the substrate 50. The first epitaxial semiconductor material 84 may then be formed in a recess formed by removing the dielectric layer. Any other suitable processes may be used to form the multi-layer stack 70 and the first epitaxial semiconductor material 84.

Figure 6:
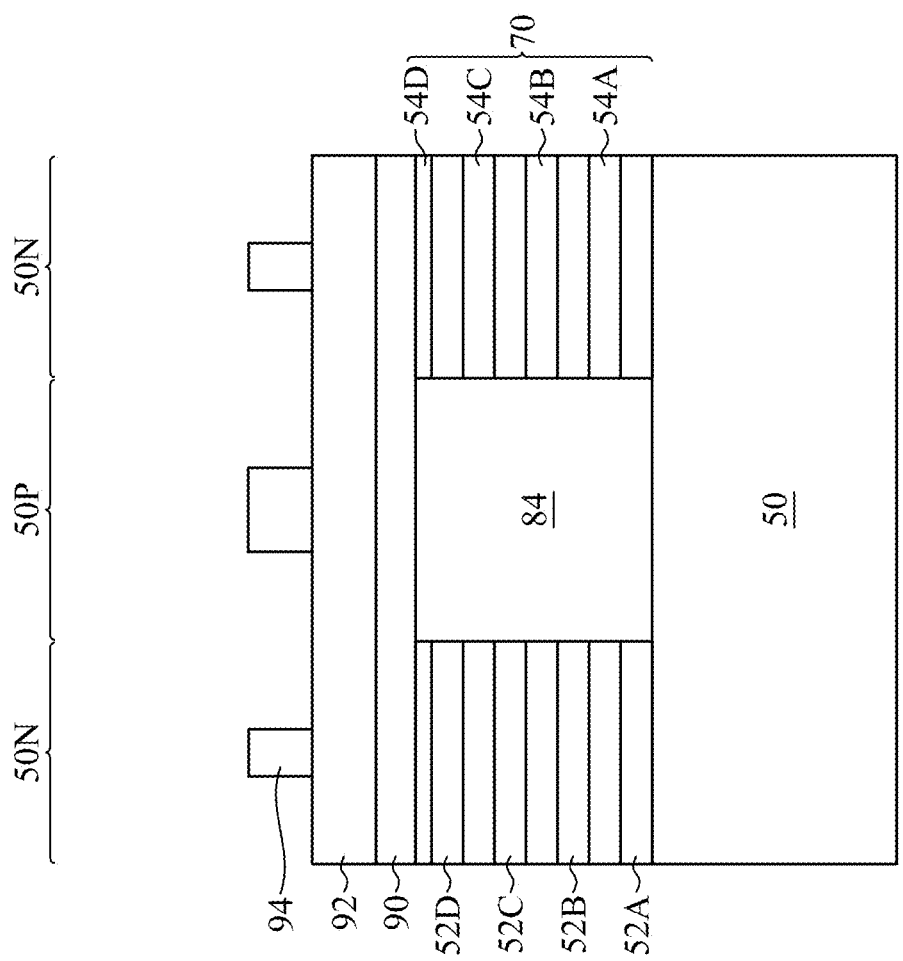
Figure 10:
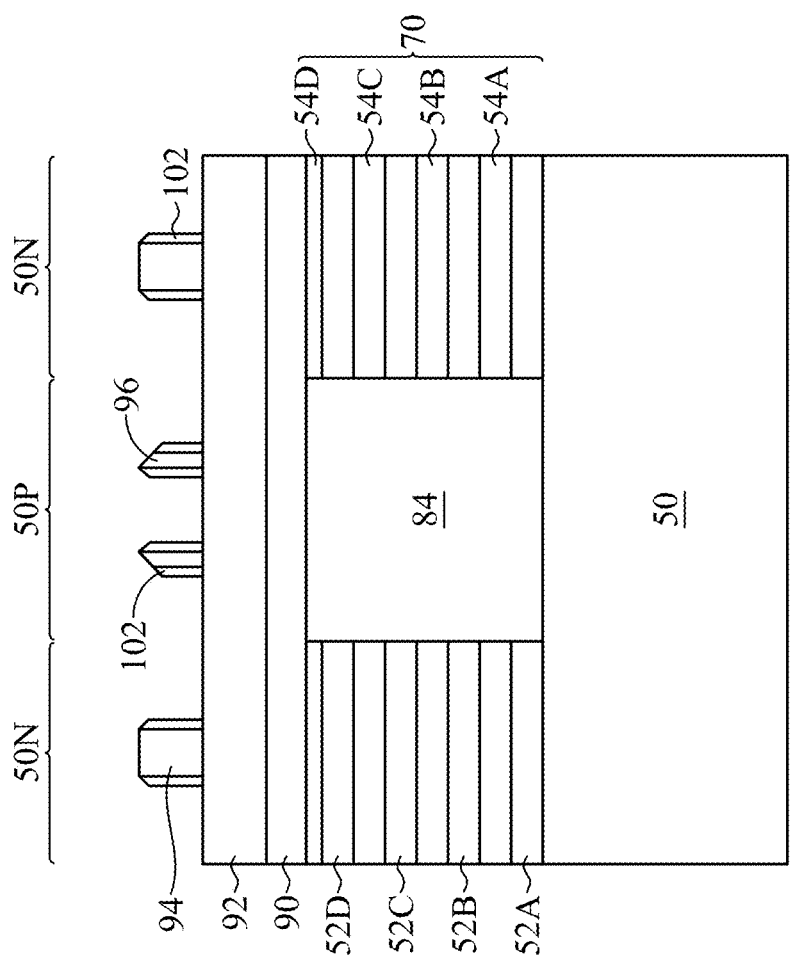
Figure 11:
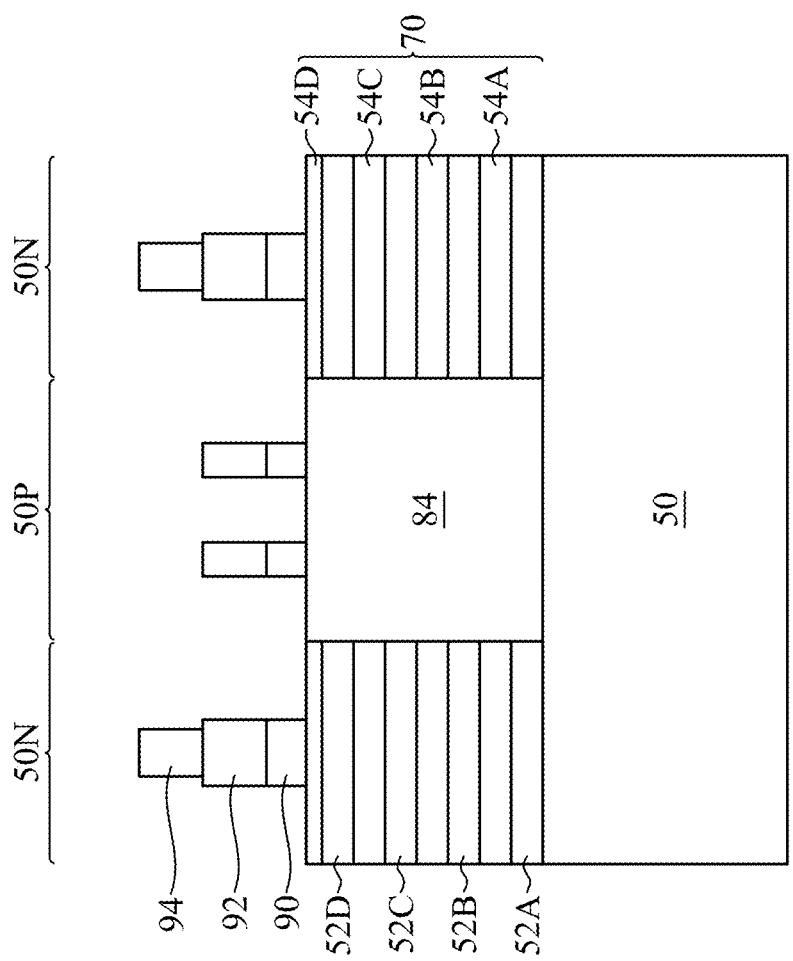
Figure 12:
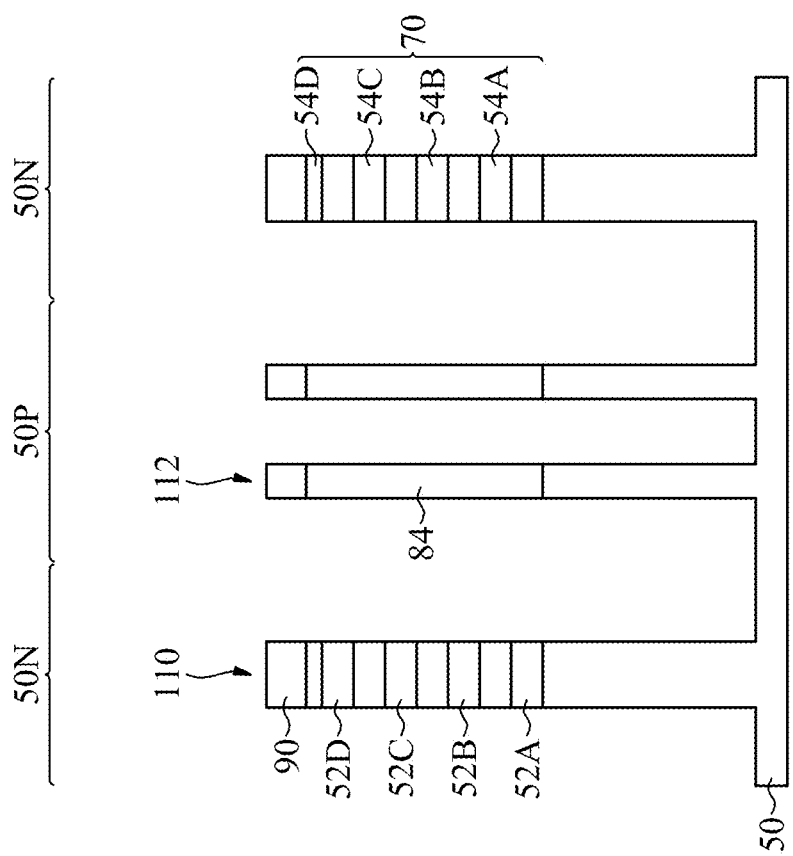

In FIGS. 6-12, the multi-layer stack 70 and the first epitaxial semiconductor material 84 are patterned to form nanostructures (such as the nanostructures 110, discussed below with respect to FIG. 12) and fins (such as the fins 112, discussed below with respect to FIG. 12), respectively. In FIG. 6, one or more mask layers are formed over the multi-layer stack 70 and the first epitaxial semiconductor material 84. For example, in some embodiments, a first mask layer 90, a second mask layer 92, and a patterned mask, such as a patterned mask 94, are formed over the multi-layer stack 70 and the first epitaxial semiconductor material 84. The first mask layer 90 may comprise a nitride, such as silicon nitride (SiN); a high high-k dielectric material, such as hafnium dioxide ($HfO_2$), zirconium dioxide ($ZrO_2$), tantalum oxide ($Ta_2O_5$), titanium dioxide ($TiO_2$), or the like; or the like. The first mask layer 90 may have a thickness from about 20 nm to about 25 nm, such as about 22.5 nm. The first mask layer 90 may be deposited by a process such as CVD, physical vapor deposition (PVD), ALD, or the like. The second mask layer 92 may comprise an oxide, such as silicon oxide or the like. The second mask layer 92 may have a thickness from about 50 nm to about 60 nm, such as about 55 nm. The second mask layer 92 may be deposited by a process such as CVD, PVD, ALD, or the like. The patterned mask 94 may comprise silicon, such as amorphous silicon (a-Si); a high high-k dielectric material, such as hafnium dioxide ($HfO_2$), zirconium dioxide ($ZrO_2$), tantalum oxide ($Ta_2O_5$), titanium dioxide ($TiO_2$), or the like; or the like. The patterned mask 94 may be formed using CVD, PVD, ALD, or the like. The patterned mask 94 may have a thickness from about 60 nm to about 80 nm, such as about 70 nm. In some embodiments, the patterned mask 94 may be formed of a material having etch selectivity to the second mask layer 92 such that the patterned mask 94 may be removed without etching or removing the second mask layer 92.

The patterned mask 94 may be patterned by using photolithography and etching. For example, a mask layer (not separately illustrated) may be deposited over the second mask layer 92. A photoresist layer (not separately illustrated) may be deposited over the mask layer using spin-on coating or the like. The photoresist layer may then be patterned by exposing the photoresist layer to a patterned energy source (e.g., a patterned light source) and developing the photoresist layer to remove an exposed or unexposed portion of the photoresist layer, thereby forming a patterned photoresist. The pattern of the patterned photoresist may then be transferred to the mask layer to form the patterned mask 94 using a suitable etching process, such as RIE, NBE, the like, or a combination thereof. The etching process may be anisotropic. The patterned photoresist may be removed by any acceptable process, such as an ashing process, a stripping process, the like, or a combination thereof.

Figure 7:
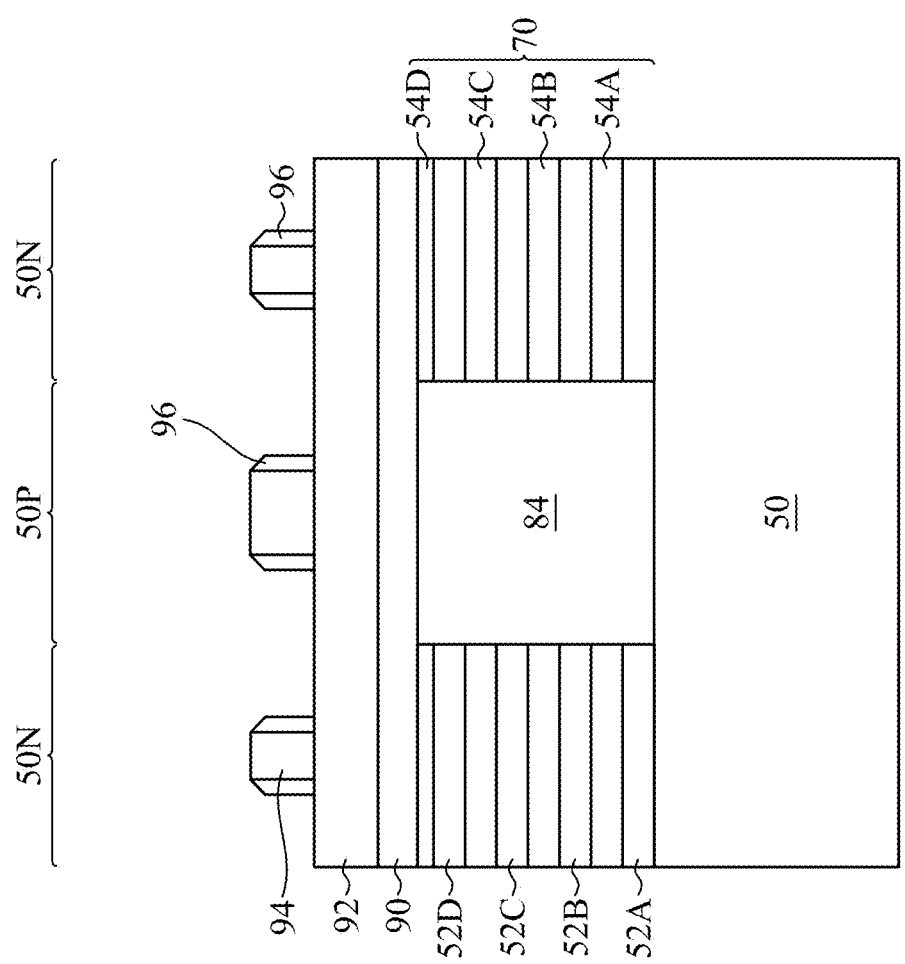

In FIG. 7, first spacers 96 are formed along sidewalls of the patterned mask 94. The first spacers 96 may have a thickness from about 8 nm to about 10 nm, such as about 9 nm. The first spacers 96 may comprise a nitride (such as silicon nitride (SiN)), an oxide (such as silicon oxide), the like, or a combination thereof. The first spacers 96 may be deposited by a process such as CVD, PVD, ALD, or the like.

The first spacers 96 may be subsequently anisotropically etched using a process such as RIE, NBE, or the like such that only portions on sidewalls of the patterned mask 94 remain. In various embodiments, the first spacers 96 may be formed of a material having etch selectivity to the second mask layer 92 and the patterned mask 94 such that the first spacers 96 may be removed without etching or removing the second mask layer 92 or the patterned mask 94.

Figure 8:
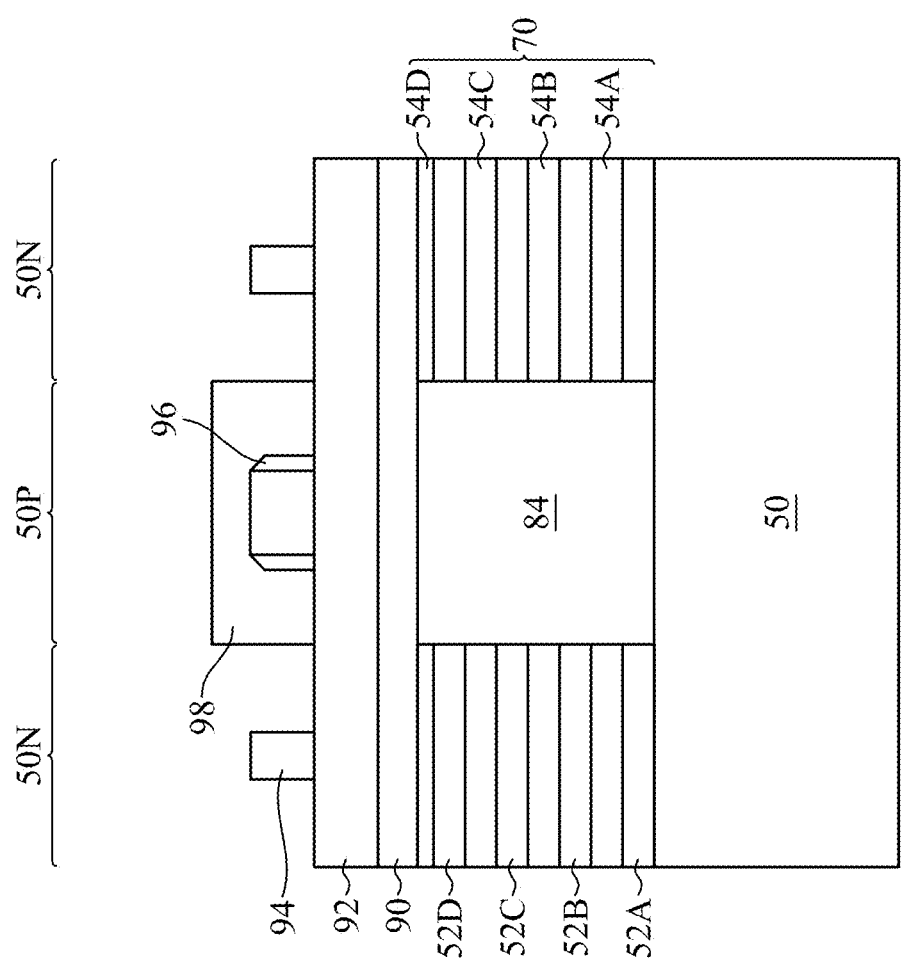

In FIG. 8, a patterned mask, such as a second patterned photoresist 98, is formed over the region 50P and the first spacers 96 are removed from the regions 50N. The second patterned photoresist 98 may be formed by depositing a photoresist layer over the structure illustrated in FIG. 7 using spin-on coating or the like. The photoresist layer may then be patterned by exposing the photoresist layer to a patterned energy source (e.g., a patterned light source) and developing the photoresist layer to remove an exposed or unexposed portion of the photoresist layer, thereby forming the second patterned photoresist 98. The first spacers 96 may then be removed from the regions 50N using a suitable etching process, such as isotropic etching (e.g., a wet etch process), anisotropic etching (e.g., a dry etch process), or the like. The second patterned photoresist 98 may be removed by any acceptable process, such as an ashing process, a stripping process, the like, or a combination thereof. In some embodiments additional masking layers may be used with the second patterned photoresist 98 to provide additional protection during the etching process to remove the first spacers 96 from the regions 50N.

Figure 9:
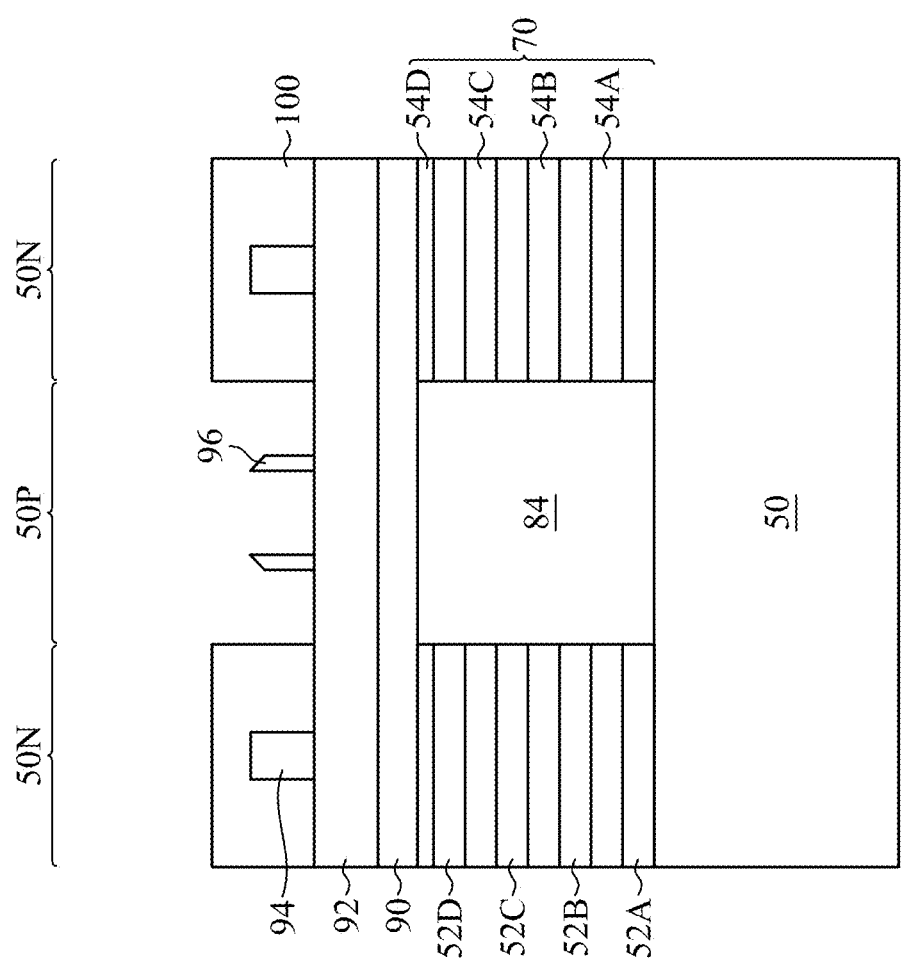

In FIG. 9, a patterned mask, such as a third patterned photoresist 100, is formed over the regions 50N and the patterned mask 94 is removed from the region 50P. The third patterned photoresist 100 may be formed by depositing a photoresist layer over the structure illustrated in FIG. 8 (after the second patterned photoresist is removed) using spin-on coating or the like. The photoresist layer may then be patterned by exposing the photoresist layer to a patterned energy source (e.g., a patterned light source) and developing the photoresist layer to remove an exposed or unexposed portion of the photoresist layer, thereby forming the third patterned photoresist 100. The patterned mask 94 may then be removed from the region 50P using a suitable etching process, such as isotropic etching (e.g., a wet etch process), anisotropic etching (e.g., a dry etch process), or the like. The third patterned photoresist 100 may be removed by any acceptable process, such as an ashing process, a stripping process, the like, or a combination thereof. In some embodiments additional masking layers may be used with the third patterned photoresist 100 to provide additional protection during the etching process to remove the patterned mask 94 from the region 50P.

In FIG. 10, second spacers 102 are formed adjacent the patterned mask 94 and the first spacers 96. The second spacers 102 may have a thickness from about 2 nm to about 4 nm, such as about 3 nm. The second spacers 102 may comprise a nitride (such as silicon nitride (SiN)), an oxide (such as silicon oxide), the like, or a combination thereof. The second spacers 102 may be deposited by a process such as CVD, PVD, ALD, or the like. The second spacers 102 may be subsequently anisotropically etched using a process such as RIE, NBE, or the like such that only portions on sidewalls of the patterned mask 94 and the first spacers 96 remain. The second spacers 102 may be used to enlarge the patterned mask 94 and/or the first spacers 96 if desired.

In FIG. 11, the second mask layer 92 and the first mask layer 90 are etched using the patterned mask 94, the first spacers 96, and the second spacers 102 as masks. The second mask layer 92 and the first mask layer 90 may be etched using anisotropic etch processes, such as RIE, NBE, or the like. The second mask layer 92 and the first mask layer 90 may be etched by a single process or multiple processes. As illustrated in FIG. 11, the first spacers 96 and the second spacers 102 may be consumed by the processes used to etch the second mask layer 92 and the first mask layer 90.

In FIG. 12, the patterned mask 94, the second mask layer 92, and the first mask layer 90 are used as masks to etch the multi-layer stack 70, the first epitaxial semiconductor material 84, and the substrate 50, forming nanostructures 110 in the regions 50N and fins 112 in the region 50P. The multi-layer stack 70, the first epitaxial semiconductor material 84, and the substrate 50 may be etched using anisotropic etching processes such as RIE, NBE, or the like. As illustrated in FIG. 12, the patterned mask 94 and the second mask layer 92 may be consumed by the processes used to etch the multi-layer stack 70, the first epitaxial semiconductor material 84, and the substrate 50.

The nanostructures 110 may have widths from about 10 nm to about 40 nm, such as about 30 nm. The fins 112 may have widths from about 6 nm to about 8 nm, such as about 7 nm. A ratio of the widths of the nanostructures 110 to the widths of the fins 112 may be from about 3 to about 8. Adjacent nanostructures 110 in the regions 50N may have a fin-to-fin spacing from about 40 nm to about 50 nm, such as about 45 nm. Adjacent fins 112 in the region 50P may have a fin-to-fin spacing from about 35 nm to about 45 nm, such as about 40 nm. Nanostructures 110 in the regions 50N may have a fin-to-fin spacing from adjacent fins 112 in the region 50P from about 40 nm to about 55 nm, such as about 47.5 nm. A ratio of the fin-to-fin spacing in the regions 50N to the region 50P may be from about 1 to about 1.5, such as about 1.2. Because the fins 112 have widths less than widths of the nanostructures 110 and the fin-to-fin spacing in the region 50P including the fins 112 is less than the fin-to-fin spacing in the regions 50N including the nanostructures 110, including both the nanostructures 110 and the fins 112 reduces the area required for semiconductor devices including the nanostructures 110 and the fins 112.

Additionally, NSFET devices may have stronger device performance, faster speeds, smaller threshold voltage ($V_T$) mismatch, and lower minimum power supply voltage ($V_{ccmin}$). FinFET devices may have better N/P well boundaries, reduced leakage, and reduced latch-up issues. Including the nanostructures 110 in the regions 50N and the fins 112 in the region 50P allows semiconductor devices including both NSFETs and FinFETs to optimize the advantages of both the NSFETs and the FinFETs to improve device performance, optimize cell area, and reduce device defects.

Figure 13:
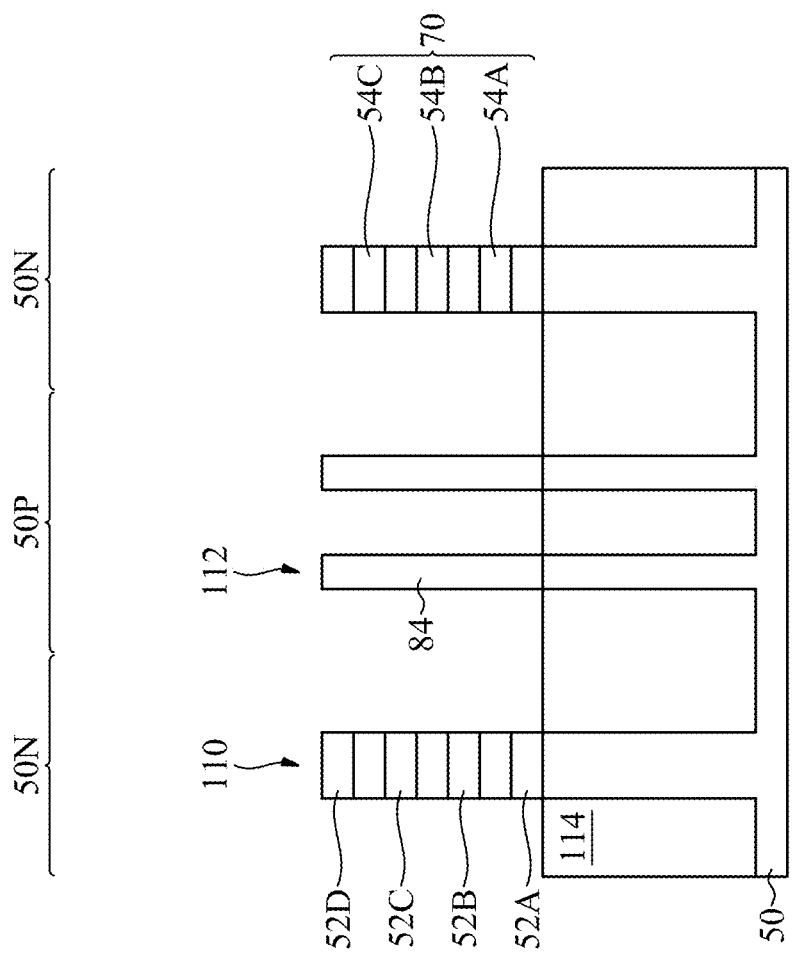

In FIG. 13, shallow trench isolation regions 114 are formed adjacent the nanostructures 110 and the fins 112 and the first mask layer 90 is removed. The STI regions 114 may be formed by forming an insulation material (not separately illustrated) over the substrate 50 and between neighboring nanostructures 110 and fins 112. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system with post curing to convert the deposited material to another material, such as an oxide), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the nanostructures 110 and the fins 112. The insulation material may comprise a single layer or may utilize multiple layers. For example, in some embodiments a liner (not separately illustrated) may first be formed along surfaces of the substrate 50, the nanostructures 110, and the fins 112. Thereafter, a fill material, such as those discussed above may be formed over the liner.

A removal process is then applied to the insulation material to remove excess insulation material over the nanostructures 110 and the fins 112. In some embodiments, a planarization process such as a chemical mechanical polish (CMP), an etch-back process, combinations thereof, or the like may be utilized. The planarization process may remove the first mask layer 90 and planarize the nanostructures 110 and the fins 112. The planarization process exposes the nanostructures 110 and the fins 112 such that top surfaces of the nanostructures 110 and the fins 112 and the insulation material are level after the planarization process is complete.

The insulation material is then recessed to form the STI regions 114 as illustrated in FIG. 13. The insulation material is recessed such that upper portions of the nanostructures 110 in the regions 50N and the fins 112 in the region 50P protrude from between neighboring STI regions 114. Further, the top surfaces of the STI regions 114 may have flat surfaces as illustrated, convex surfaces, concave surfaces (such as dishing), or a combination thereof. The top surfaces of the STI regions 114 may be formed flat, convex, and/or concave by an appropriate etch. The STI regions 114 may be recessed using an acceptable etching process, such as one that is selective to the material of the insulation material (e.g., etches the material of the insulation material at a faster rate than the material of the nanostructures 110 and the fins 112). For example, an oxide removal using, for example, dilute hydrofluoric (dHF) acid may be used.

Further in FIG. 13, appropriate wells (not separately illustrated) may be formed in the nanostructures 110, the fins 112, and/or the substrate 50. In some embodiments, P wells may be formed in the regions 50N, and an N well may be formed in the region 50P. In further embodiments, P wells N wells may be formed in each of the regions 50N and the region 50P.

In embodiments including different well types, different implant steps for the regions 50N and the region 50P may be achieved using a photoresist or other masks (not separately illustrated). For example, a photoresist may be formed over the nanostructures 110 and the STI regions 114 in the regions 50N. The photoresist is patterned to expose the region 50P of the substrate 50. The photoresist can be formed by using a spin-on technique and can be patterned using acceptable photolithography techniques. Once the photoresist is patterned, an n-type impurity implant is performed in the region 50P, and the photoresist may act as a mask to substantially prevent n-type impurities from being implanted into the regions 50N. The n-type impurities may be phosphorus, arsenic, antimony, or the like implanted in the region to a concentration of equal to or less than $1\times10^{14}$ atoms/cm$^3$, such as from about $1\times10^{13}$ atoms/cm$^3$ to about $1\times10^{14}$ atoms/cm$^3$. After the implant, the photoresist is removed, such as by an acceptable ashing process.

Following the implanting of the region 50P, a photoresist is formed over the fins 112 and the STI regions 114 in the region 50P. The photoresist is patterned to expose the regions 50N of the substrate 50. The photoresist can be formed by using a spin-on technique and can be patterned using acceptable photolithography techniques. Once the photoresist is patterned, a p-type impurity implant may be performed in the regions 50N, and the photoresist may act as a mask to substantially prevent p-type impurities from being implanted into the region 50P. The p-type impurities may be boron, boron fluoride, indium, or the like implanted in the region to a concentration of equal to or less than $1\times10^{14}$ atoms/cm$^3$, such as from about $1\times10^{13}$ atoms/cm$^3$ to about $1\times10^{14}$ atoms/cm$^3$. After the implant, the photoresist may be removed, such as by an acceptable ashing process.

After the implants of the regions 50N and the region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 14:
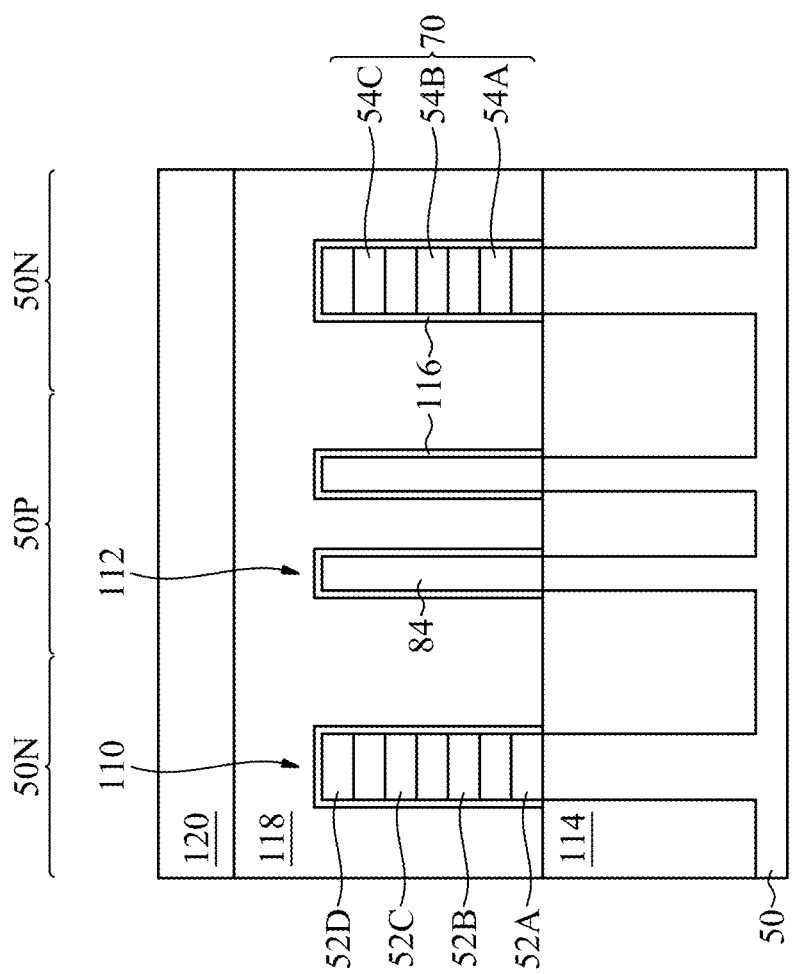

In FIG. 14, a dummy dielectric layer 116 is formed on the nanostructures 110 and the fins 112. The dummy dielectric layer 116 may be, for example, silicon oxide, silicon nitride, a combination thereof, or the like, and may be deposited or thermally grown according to acceptable techniques. A dummy gate layer 118 is formed over the dummy dielectric layer 116, and a mask layer 120 is formed over the dummy gate layer 118. The dummy gate layer 118 may be deposited over the dummy dielectric layer 116 and then planarized, such as by a CMP. The mask layer 120 may be deposited over the dummy gate layer 118. The dummy gate layer 118 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 118 may be deposited by PVD, CVD, sputter deposition, or other techniques known and used in the art for depositing the selected material. The dummy gate layer 118 may be made of other materials that have a high etching selectivity from the etching of isolation regions (e.g., the STI regions 114). The mask layer 120 may include, for example, silicon nitride, silicon oxynitride, or the like. In this example, a single dummy gate layer 118 and a single mask layer 120 are formed across the regions 50N and the region 50P. It is noted that the dummy dielectric layer 116 is shown covering only the nanostructures 110 and the fins 112 for illustrative purposes only. In some embodiments, the dummy dielectric layer 116 may be deposited such that the dummy dielectric layer 116 covers the STI regions 114, extending between the dummy gate layer 118 and the STI regions 114.

Figure 15A:
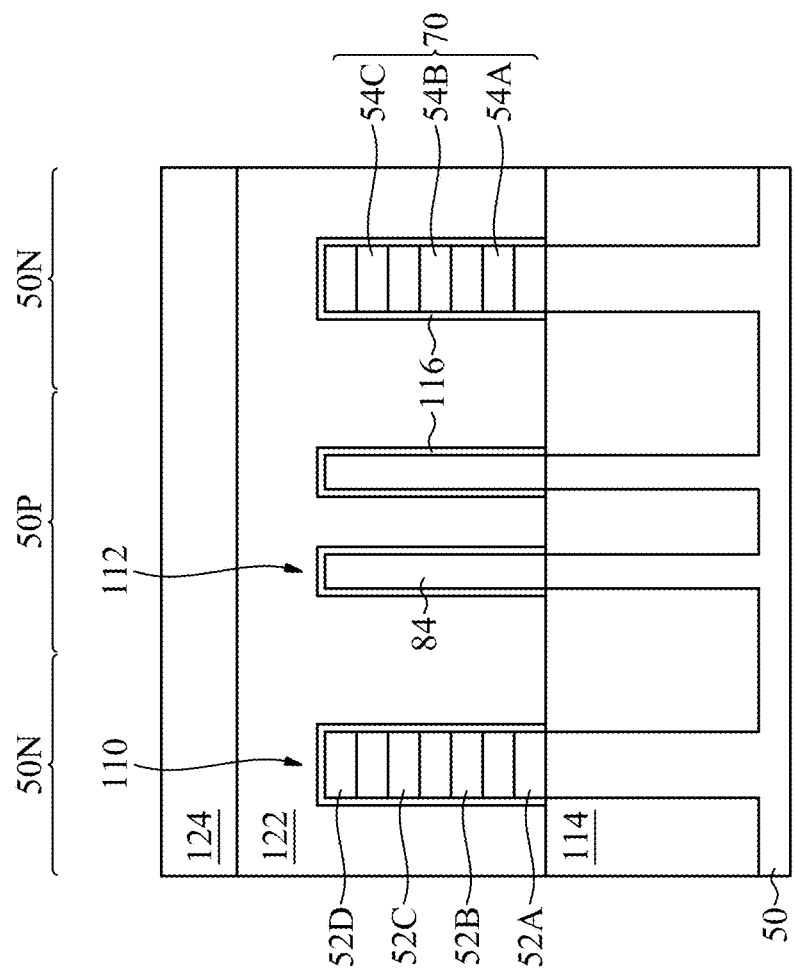
Figure 15B:
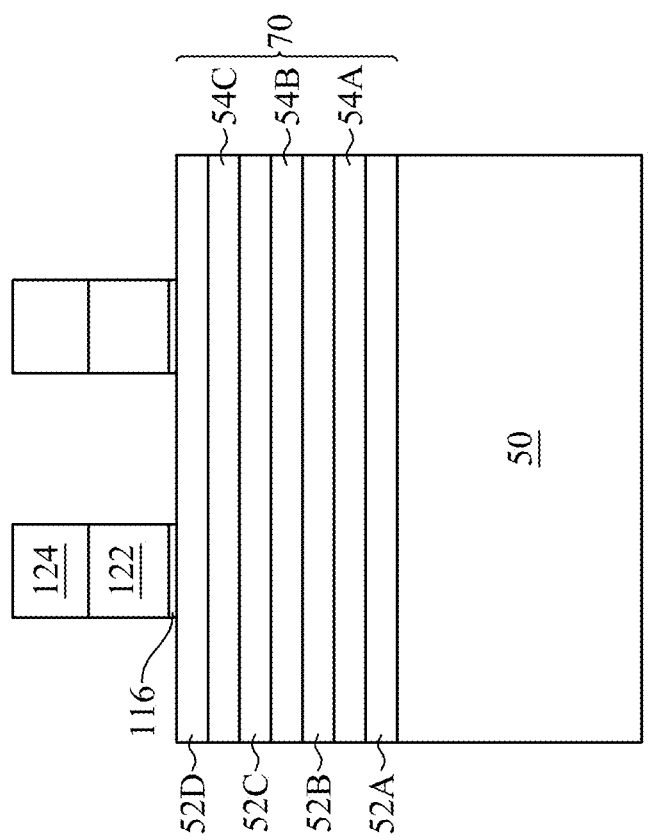
Figure 15C:
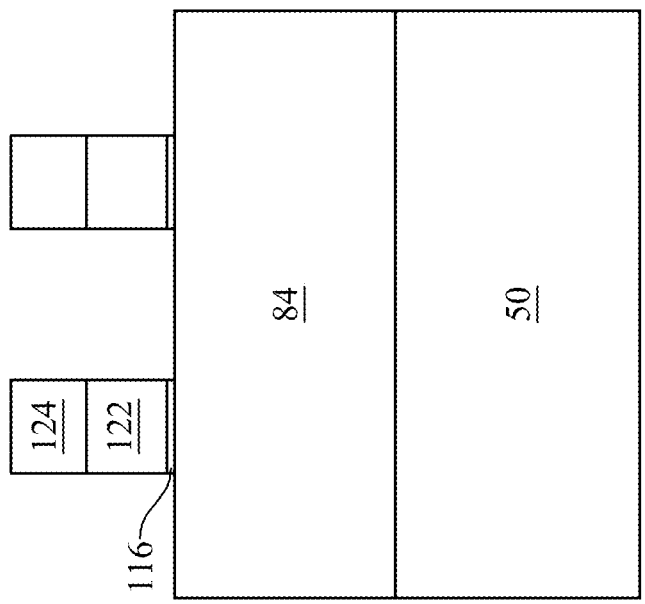

In FIGS. 15A-15C, the mask layer 120 (see FIG. 14) may be patterned using acceptable photolithography and etching techniques to form masks 124. The pattern of the masks 124 then may be transferred to the dummy gate layer 118. In some embodiments (not separately illustrated), the pattern of the masks 124 may also be transferred to the dummy dielectric layer 116 by an acceptable etching technique to form dummy gates 122. The dummy gates 122 cover respective channel regions of the nanostructures 110 and the fins 112. The pattern of the masks 124 may be used to physically pattern the dummy gate layer 118 into distinct dummy gates 122. The dummy gates 122 may also have a lengthwise direction substantially perpendicular, within process variations, to the lengthwise direction of respective nanostructures 110 and the fins 112.

Figure 16A:
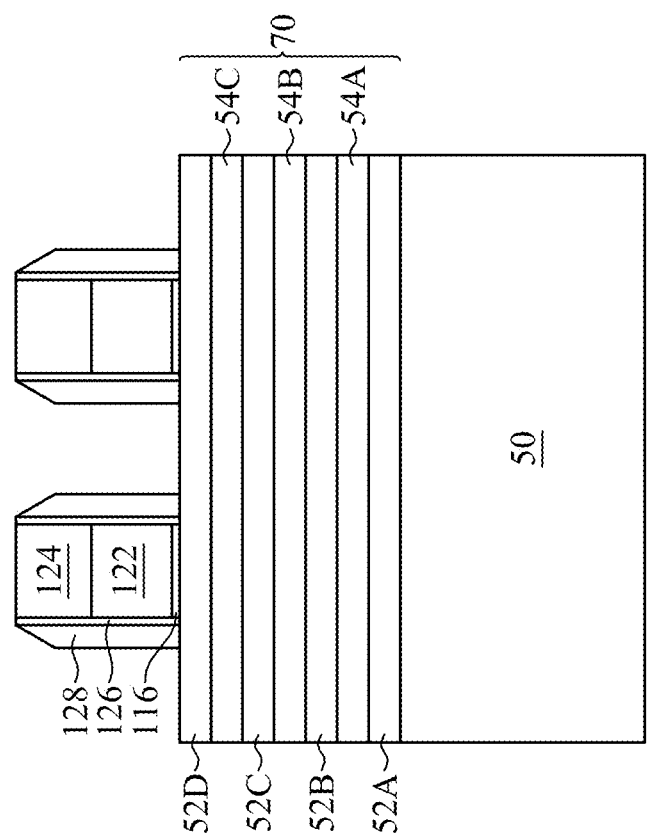
Figure 16B:
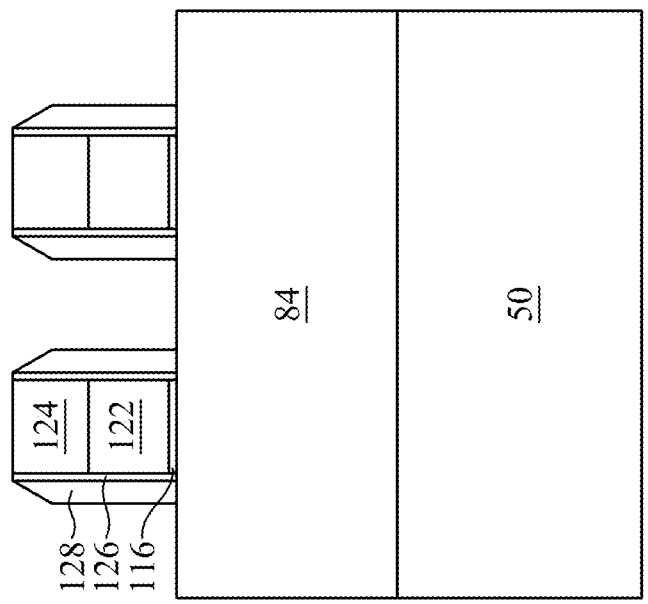

In FIGS. 16A and 16B, gate seal spacers 126 are be formed on exposed surfaces of the dummy gates 122, the masks 124, the dummy dielectric layer 116, and/or the nanostructures 110 and the fins 112. A thermal oxidation or a deposition followed by an anisotropic etch may form the gate seal spacers 126. The gate seal spacers 126 may be formed of silicon oxide, silicon nitride, silicon oxynitride, or the like.

After the formation of the gate seal spacers 126, implants for lightly doped source/drain (LDD) regions (not separately illustrated) may be performed. In the embodiments with different device types, similar to the implants discussed above in FIG. 13, a mask, such as a photoresist, may be formed over the regions 50N, while exposing the region 50P, and appropriate type (e.g., p-type) impurities may be implanted into the exposed fins 112 in the region 50P. The mask may then be removed. Subsequently, a mask, such as a photoresist, may be formed over the region 50P while exposing the regions 50N, and appropriate type impurities (e.g., n-type) may be implanted into the exposed nanostructures 110 in the regions 50N. The mask may then be removed. The n-type impurities may be any of the n-type impurities previously discussed, and the p-type impurities may be any of the p-type impurities previously discussed. The lightly doped source/drain regions may have a concentration of impurities of from about $1 \times 10^{15}$ atoms/cm$^3$ to about $1 \times 10^{19}$ atoms/cm$^3$. An anneal may be used to repair implant damage and to activate the implanted impurities.

Further in FIGS. 16A and 16B, gate spacers 128 are formed on the gate seal spacers 126 along sidewalls of the dummy gates 122, the masks 124, and the dummy dielectric layer 116. The gate spacers 128 may be formed by conformally depositing an insulating material and subsequently anisotropically etching the insulating material. The insulating material of the gate spacers 128 may be silicon oxide, silicon nitride, silicon oxynitride, silicon carbonitride, a combination thereof, or the like.

It is noted that the above disclosure generally describes a process of forming spacers and LDD regions. Other processes and sequences may be used. For example, fewer or additional spacers may be utilized, different sequence of steps may be utilized (e.g., the gate seal spacers 126 may not be etched prior to forming the gate spacers 128, yielding "L-shaped" gate seal spacers, spacers may be formed and removed, and/or the like. Furthermore, the n-type and p-type devices may be formed using a different structures and steps. For example, LDD regions for n-type devices may be formed prior to forming the gate seal spacers 126 while the LDD regions for p-type devices may be formed after forming the gate seal spacers 126.

Figure 17A:
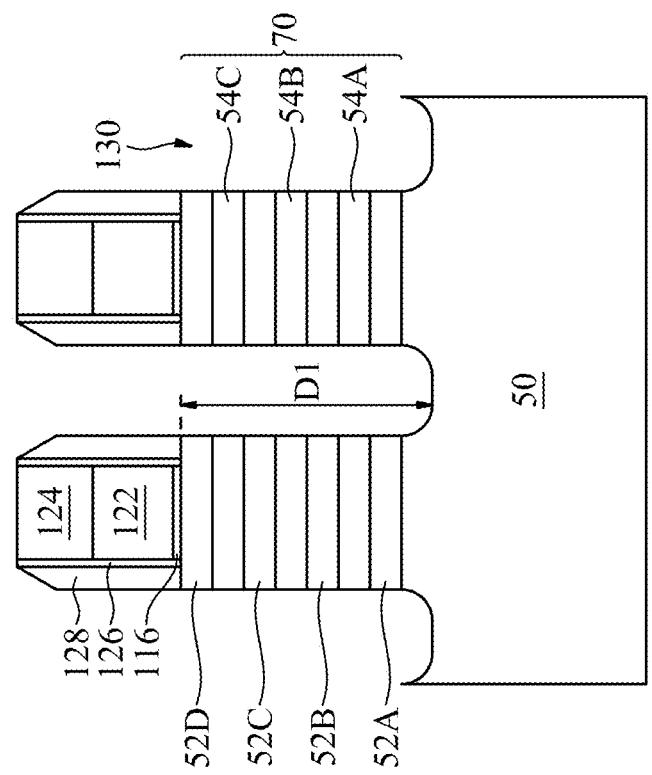
Figure 17B:
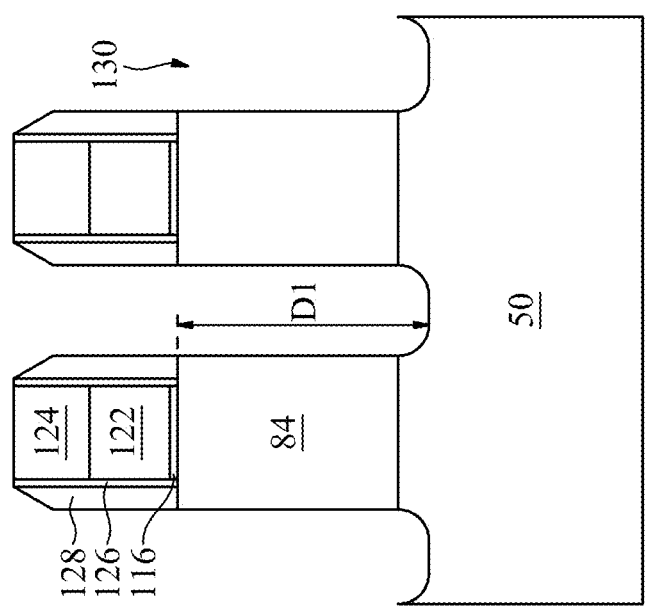

In FIGS. 17A and 17B, first recesses 130 are formed in the nanostructures 110 and the fins 112. As illustrated in FIG. 17A, the first recesses 130 in the regions 50N extend through the first semiconductor layers 52A-52D and the second semiconductor layers 54A-54C, and into the substrate 50. As illustrated in FIG. 17B, the first recesses 130 in the region 50P extend through the first epitaxial semiconductor material 84 into the substrate 50.

The first recesses 130 may be formed by etching the nanostructures 110 and the fins 112 using anisotropic etching processes, such as RIE, NBE, or the like. The gate spacers 128, the gate seal spacers 126, and the masks 124 mask portions of the nanostructures 110 and the fins 112 during the etching processes used to form the first recesses 130. A single etch process may be used to etch each layer of the multi-layer stack 70 and the first epitaxial semiconductor material 84. In other embodiments, multiple etch processes may be used to etch the layers of the multi-layer stack 70 and the first epitaxial semiconductor material 84. Timed etch processes may be used to stop the etching of the first recesses 130 after the first recesses 130 reach a desired depth.

In some embodiments, the first recesses 130 in the regions 50N may be etched separately from the first recesses 130 in the region 50P. A photoresist or other mask (not separately illustrated) may be used for separately etching the first recesses 130 in the regions 50N and the region 50P. For example, a photoresist may be formed over the structure illustrated in FIG. 16A in the regions 50N. The photoresist is patterned to expose the region 50P. The photoresist can be formed by using a spin-on technique and can be patterned using acceptable photolithography techniques. Once the photoresist is patterned, the first recesses 130 in the region 50P may be formed by etching. The etching may be performed using a hydrogen (H$_2$) plasma or the like. After the etching, the photoresist is removed, such as by an acceptable ashing process. A photoresist may then be formed over the structure illustrated in FIG. 16B in the region 50P. The photoresist is patterned to expose the regions 50N. The photoresist can be formed by using a spin-on technique and can be patterned using acceptable photolithography techniques. Once the photoresist is patterned, the first recesses 130 in the regions 50N may be formed by etching. The etching may be performed using a plasma formed from a process gas such as trifluoromethane (CHF$_3$), tetrafluoromethane (CF$_4$), hydrogen bromide (HBr), or the like. After the etching, the photoresist is removed, such as by an acceptable ashing process.

Figure 18A:
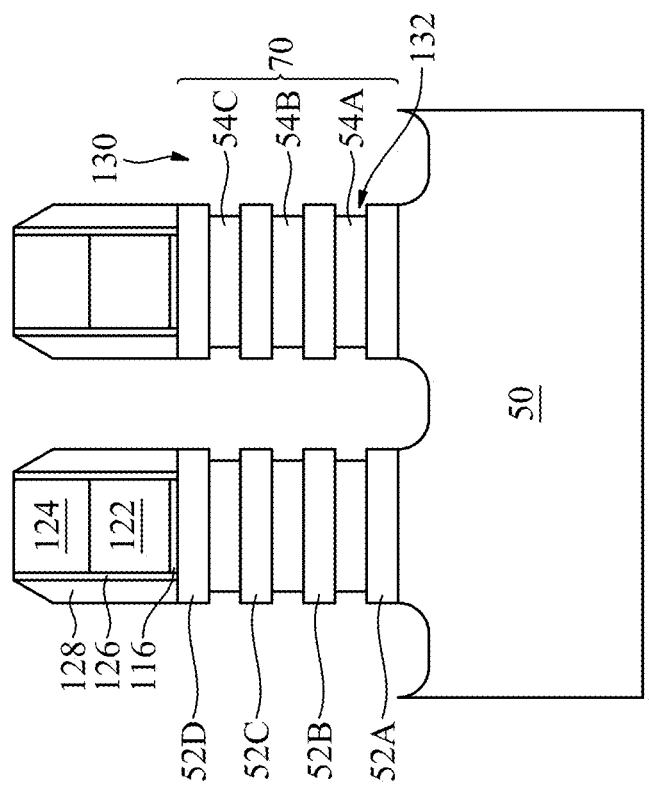
Figure 18B:
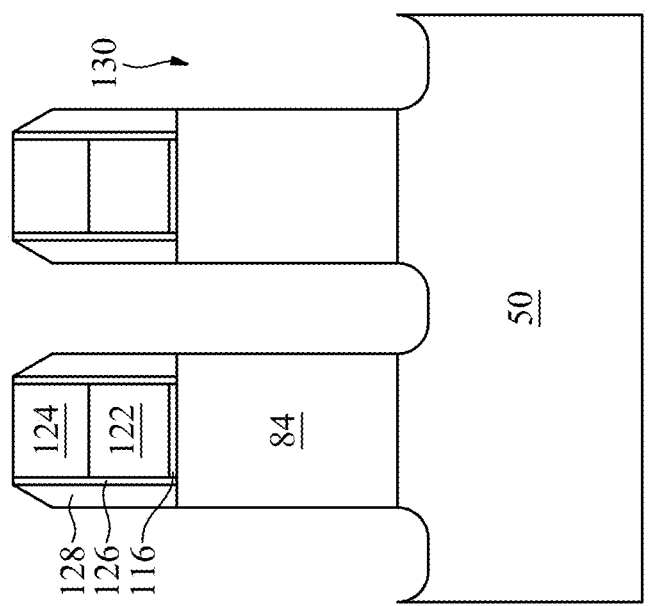

In FIGS. 18A and 18B, portions of the sidewalls of the layers of the multi-layer stack 70 formed of the second semiconductor material (e.g., the second semiconductor layers 54A-54C) exposed by the first recesses 130 are etched to form sidewall recesses 132. The sidewalls may be etched using isotropic etching processes, such as wet etching or the like. As illustrated in FIG. 18A, sidewalls of the second semiconductor layers 54A-54C may be etched in the regions 50N. A photoresist or other mask (not separately illustrated) may or may not be used to mask the region 50P during the isotropic etching of the regions 50N.

The etchants used to etch the second semiconductor layers 54A-54C may be selective to the second semiconductor materials such that the first semiconductor layers 52A-52D, the substrate 50, and the first epitaxial semiconductor material 84 remain relatively unetched as compared to the second semiconductor layers 54A-54C. In an embodiment in which the second semiconductor layers 54A-54C include, e.g., SiGe, and the first semiconductor layers 52A-52D include, e.g., Si or SiC, tetramethylammonium hydroxide (TMAH), ammonium hydroxide (NH$_4$OH), or the like may be used to etch sidewalls of the multi-layer stack 70 in the regions 50N. In further embodiments, the layers of the multi-layer stack 70 may be etched using a dry etching process. Hydrogen fluoride, another fluorine-based gas, or the like may be used to etch sidewalls of the multi-layer stack 70 in the regions 50N.

Figure 19A:
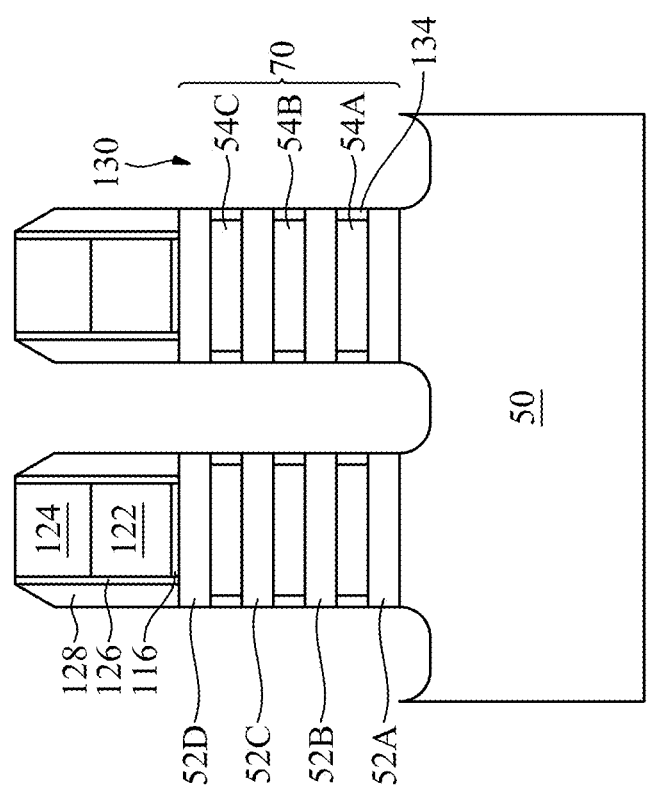
Figure 19B:
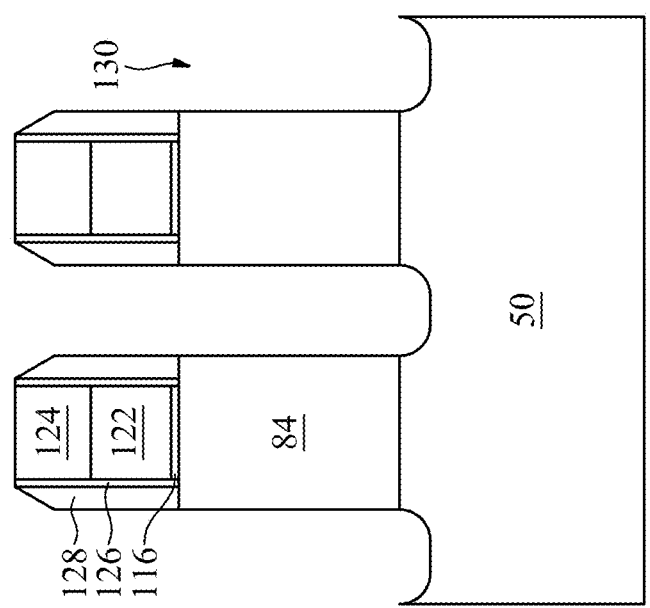

In FIGS. 19A and 19B, inner spacers 134 are formed in the sidewall recess 132. The inner spacers 134 may be formed by depositing an inner spacer layer (not separately illustrated) over the structures illustrated in FIGS. 18A and 18B. The inner spacer layer may be deposited by a conformal deposition process, such as CVD, ALD, or the like. The inner spacer layer may comprise a material such as silicon nitride or silicon oxynitride, although any suitable material, such as low-k materials having a k-value less than about 3.5, may be utilized.

The inner spacer layer may then be etched to form the inner spacers 134. The inner spacer layer may be etched by an anisotropic etching process, such as RIE, NBE, or the like. The inner spacers 134 may be used to prevent damage to subsequently formed source/drain regions (such as the epitaxial source/drain regions 136, discussed below with respect to FIGS. 20A and 20B) by subsequent etching processes.

Figure 20A:
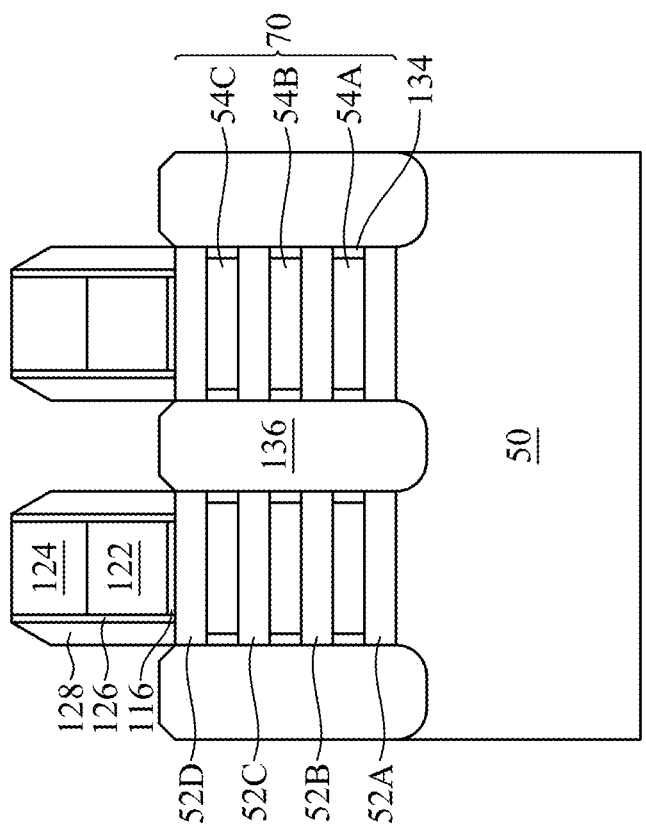
Figure 20B:
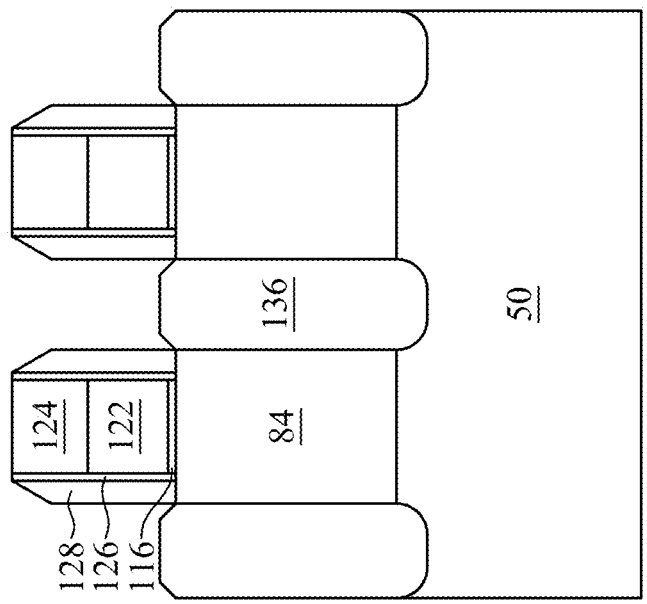

In FIGS. 20A and 20B epitaxial source/drain regions 136 are formed in the first recesses 130 to exert stress on the channel layers of the multi-layer stack 70 and the first epitaxial semiconductor material 84, thereby improving performance. The epitaxial source/drain regions 136 are formed in the first recesses 130 such that each dummy gate 122 is disposed between respective neighboring pairs of the epitaxial source/drain regions 136. In some embodiments, the gate spacers 128 are used to offset the epitaxial source/drain regions 136 from the dummy gates 122 by an appropriate lateral distance so that the epitaxial source/drain regions 136 do not short out subsequently formed gates of the resulting NSFETs and FinFETs. The inner spacers 134 may also be used to separate the epitaxial source/drain regions 136 from the dummy gates 122 and to prevent shorts between the epitaxial source/drain regions 136 and subsequently formed gates of the resulting NSFETs and FinFETs.

The epitaxial source/drain regions 136 in the regions 50N, e.g., the NMOS regions, may be formed by masking the region 50P, e.g., the PMOS region. Then, the epitaxial source/drain regions 136 in the regions 50N are epitaxially grown in the first recesses 130. The epitaxial source/drain regions 136 may include any acceptable material, such as appropriate for n-type NSFETs. For example, in an embodiment in which the first semiconductor layers 52A-52D are formed of the first semiconductor material (e.g., Si or SiC), the epitaxial source/drain regions 136 in the regions 50N may include materials exerting a tensile strain on the first semiconductor layers 52A-52D, such as silicon, silicon carbide, phosphorous doped silicon carbide, silicon phosphide, or the like. The epitaxial source/drain regions 136 in the regions 50N may have surfaces raised from respective surfaces of the multi-layer stack 70 and may have facets.

The epitaxial source/drain regions 136 in the region 50P, e.g., the PMOS region, may be formed by masking the regions 50N, e.g., the NMOS regions. Then, the epitaxial source/drain regions 136 in the region 50P are epitaxially grown in the first recesses 130. The epitaxial source/drain regions 136 may include any acceptable material, such as appropriate for p-type NSFETs. For example, in an embodiment in which the first epitaxial semiconductor material 84 is formed of a material such as silicon, the epitaxial source/drain regions 136 in the region 50P may comprise materials exerting a compressive strain on the first epitaxial semiconductor material 84, such as silicon-germanium, boron doped silicon-germanium, germanium, germanium tin, or the like. The epitaxial source/drain regions 136 in the region 50P may also have surfaces raised from respective surfaces of the first epitaxial semiconductor material 84 and may have facets.

The epitaxial source/drain regions 136, the multi-layer stack 70, and/or the first epitaxial semiconductor material 84 may be implanted with dopants to form source/drain regions, similar to the process previously discussed for forming lightly-doped source/drain regions, followed by an anneal. The source/drain regions may have an impurity concentration from about $1\times10^{19}$ atoms/cm$^3$ to about $1\times10^{21}$ atoms/cm$^3$. The n-type and/or p-type impurities for source/drain regions may be any of the impurities previously discussed. In some embodiments, the epitaxial source/drain regions 136 may be in situ doped during growth.

Figure 21A:
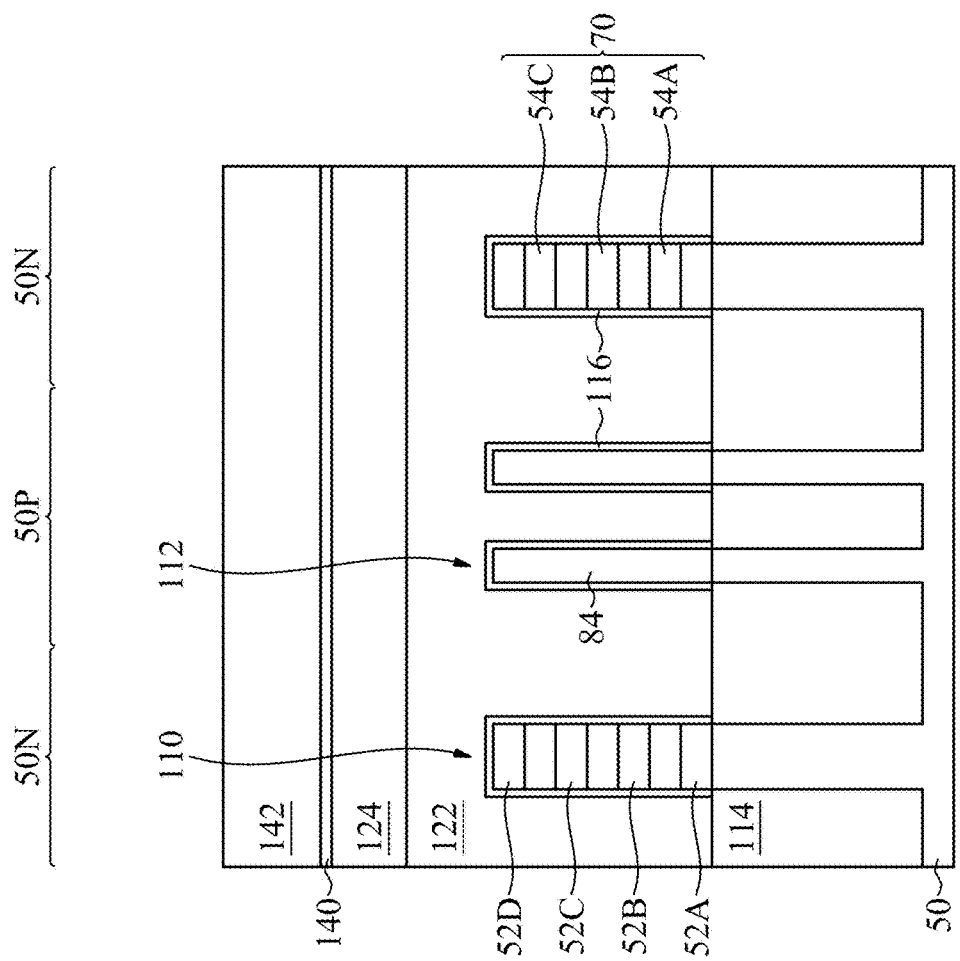
Figure 21B:
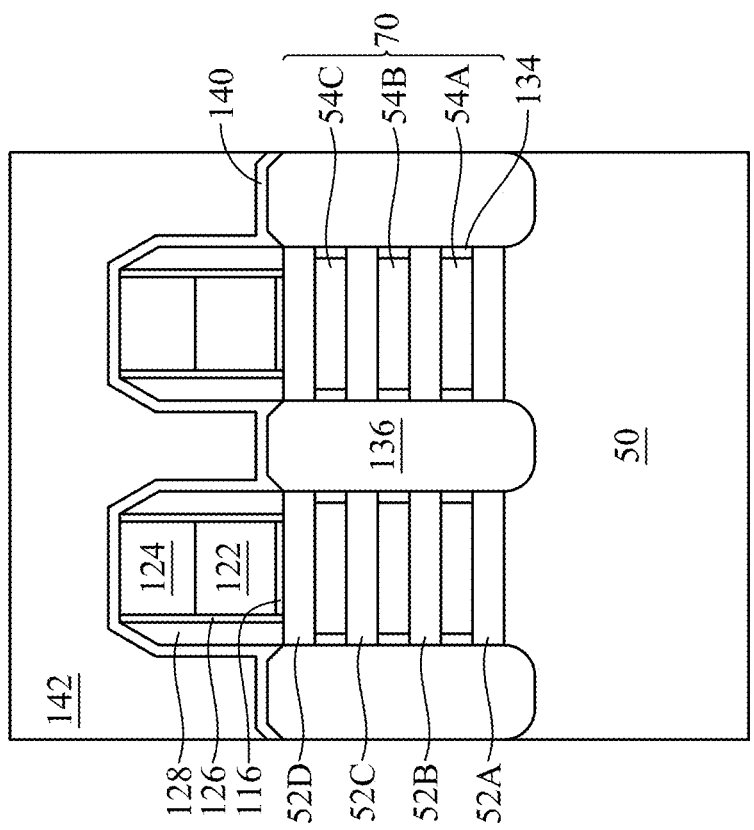
Figure 21C:
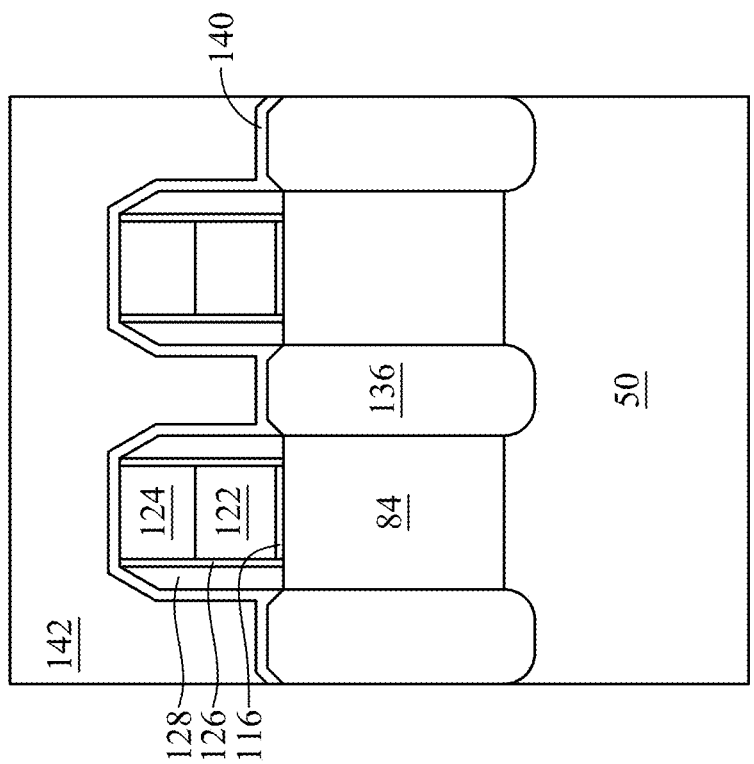

In FIGS. 21A-21C, a first interlayer dielectric (ILD) 142 is deposited over the structure illustrated in FIGS. 15A, 20A, and 20B (the processes of FIGS. 16A-20B do not alter the cross-section illustrated in FIG. 15A). The first ILD 142 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 140 is disposed between the first ILD 142 and the epitaxial source/drain regions 136, the masks 124, the gate spacers 128, and the gate seal spacers 126. The CESL 140 may comprise a dielectric material, such as, silicon nitride, silicon oxide, silicon oxynitride, or the like, having a different etch rate than the material of the overlying first ILD 142.

Figure 22A:
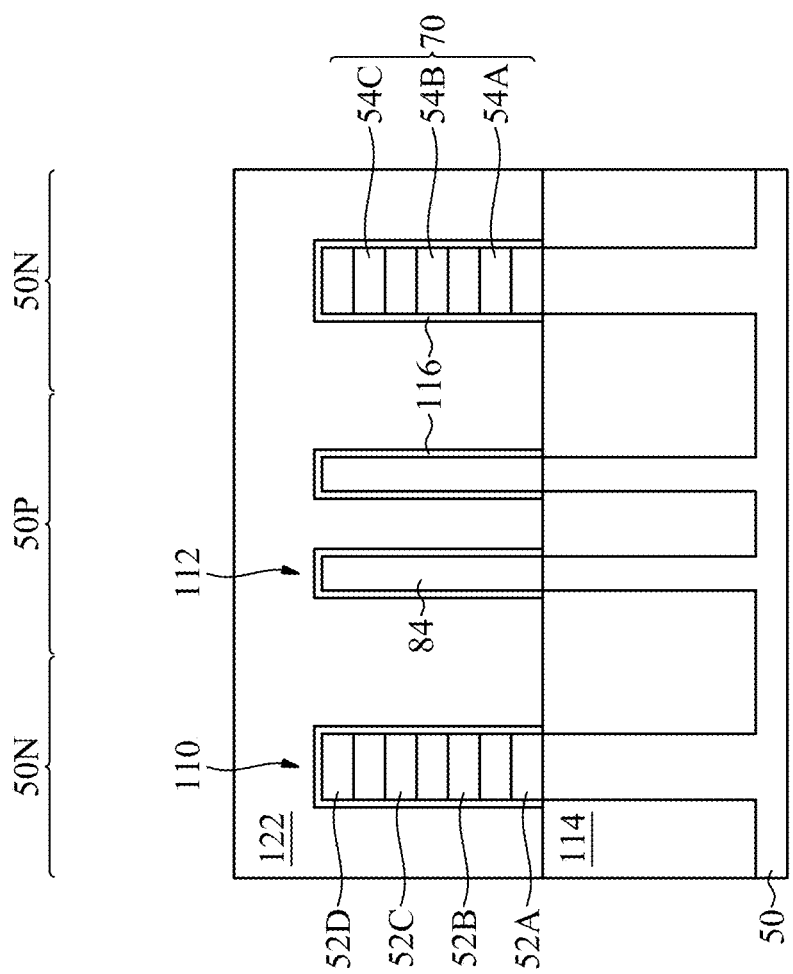
Figure 22B:
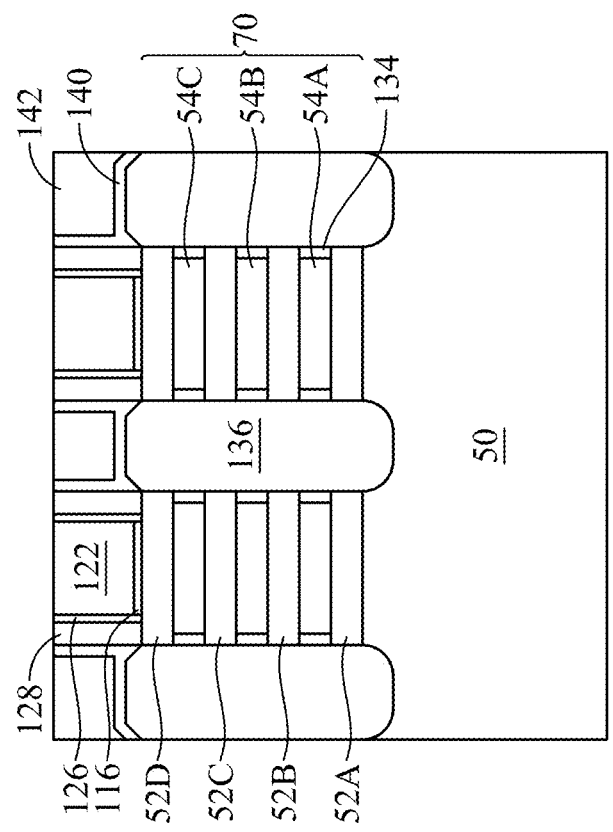
Figure 22C:
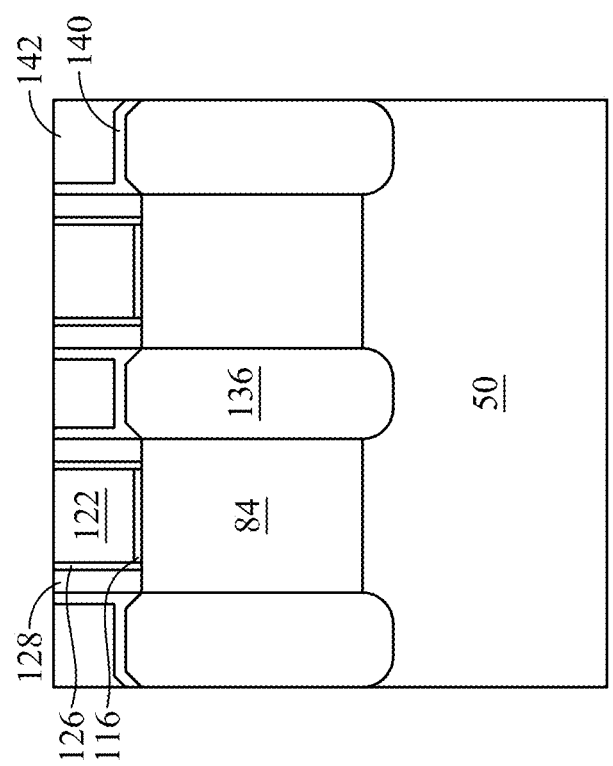

In FIGS. 22A-22C, a planarization process, such as a CMP, may be performed to level the top surface of the first ILD 142 with the top surfaces of the dummy gates 122 or the masks 124. The planarization process may also remove the masks 124 on the dummy gates 122, and portions of the gate seal spacers 126 and the gate spacers 128 along sidewalls of the masks 124. After the planarization process, top surfaces of the dummy gates 122, the gate seal spacers 126, the gate spacers 128, and the first ILD 142 are level. Accordingly, the top surfaces of the dummy gates 122 are exposed through the first ILD 142. In some embodiments, the masks 124 may remain, in which case the planarization process levels the top surface of the first ILD 142 with top surface of the masks 124, the gate seal spacers 126, and the gate spacers 128.

Figure 23A:
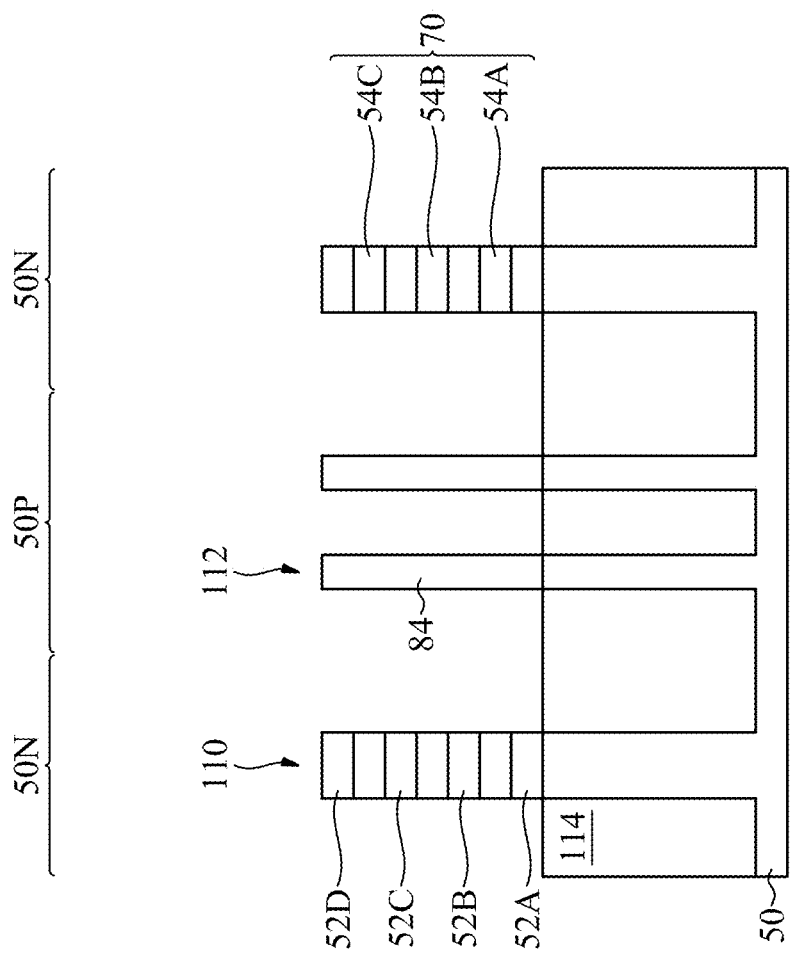
Figure 23B:
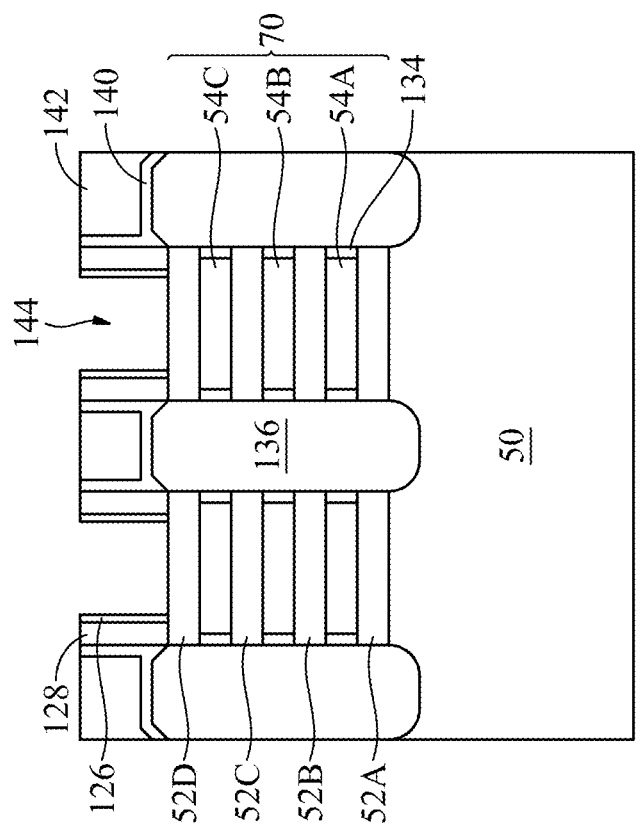
Figure 23C:
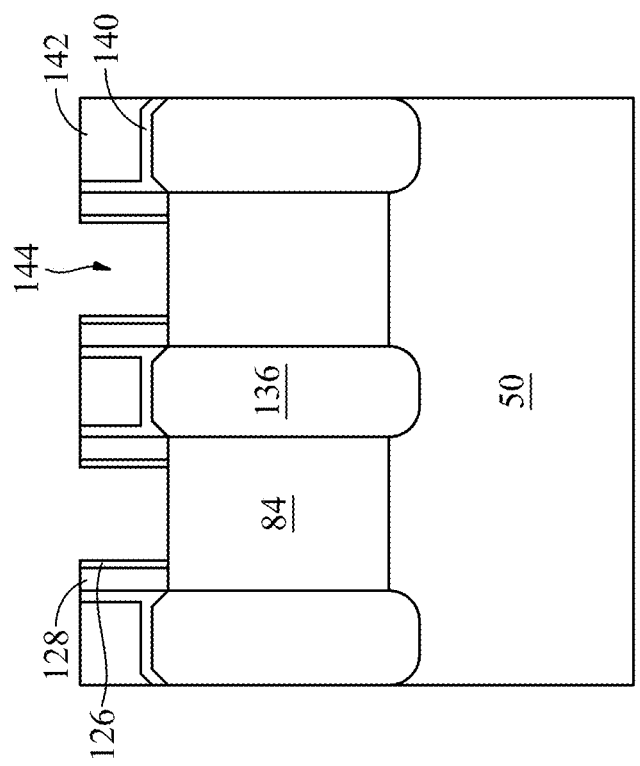

In FIGS. 23A-23C, the dummy gates 122, and the masks 124 if present, are removed in an etching step(s), so that second recesses 144 are formed. Portions of the dummy dielectric layer 116 in the second recesses 144 may also be removed. In some embodiments, only the dummy gates 122 are removed and the dummy dielectric layer 116 remains and is exposed by the second recesses 144. In some embodiments, the dummy dielectric layer 116 is removed from second recesses 144 in a first region of a die (e.g., a core logic region) and remains in second recesses 144 in a second region of the die (e.g., an input/output region). In some embodiments, the dummy gates 122 are removed by an anisotropic dry etch process. For example, the etching process may include a dry etch process using reaction gas(es) that selectively etch the dummy gates 122 at a faster rate than the first ILD 142, the gate seal spacers 126, or the gate spacers 128. Each second recess 144 exposes and/or overlies the multi-layer stacks 70 or the first epitaxial semiconductor material 84, which act as channel regions in subsequently completed NSFETs and FinFETs. Portions of the multi-layer stacks 70 or the first epitaxial semiconductor material 84 which act as the channel regions are disposed between neighboring pairs of the epitaxial source/drain regions 136. During the removal, the dummy dielectric layer 116 may be used as an etch stop layer when the dummy gates 122 are etched. The dummy dielectric layer 116 may then be optionally removed after the removal of the dummy gates 122.

Figure 24A:
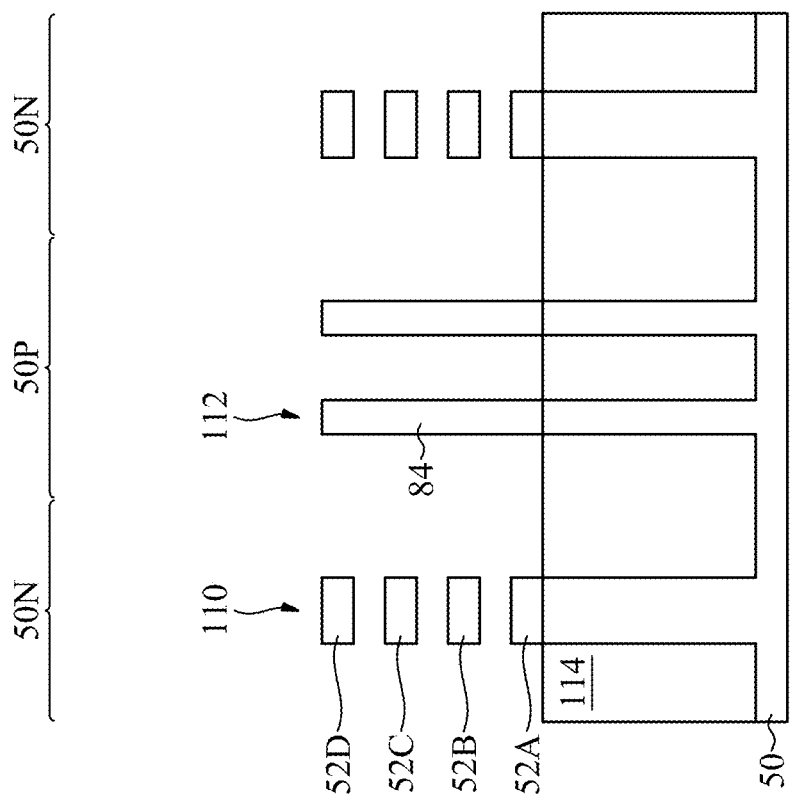
Figure 24B:
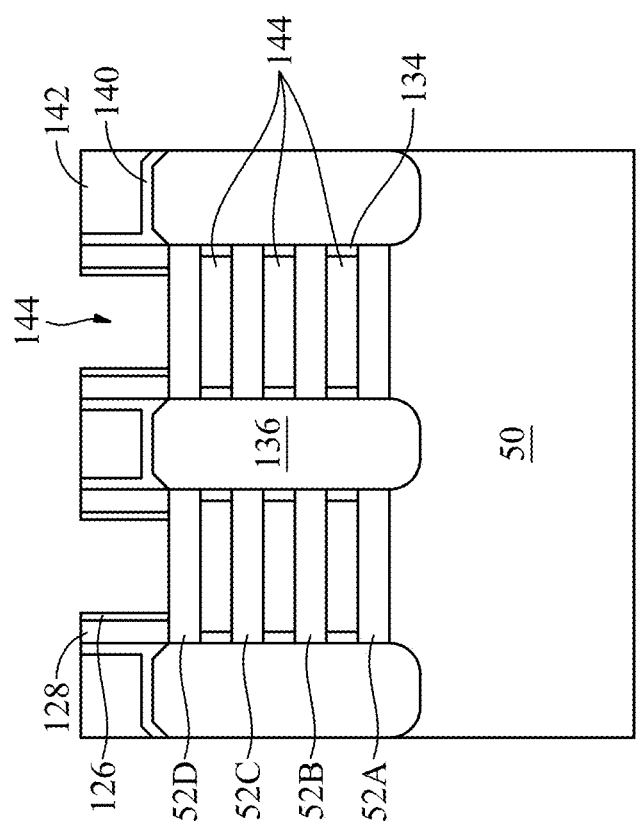
Figure 24C:
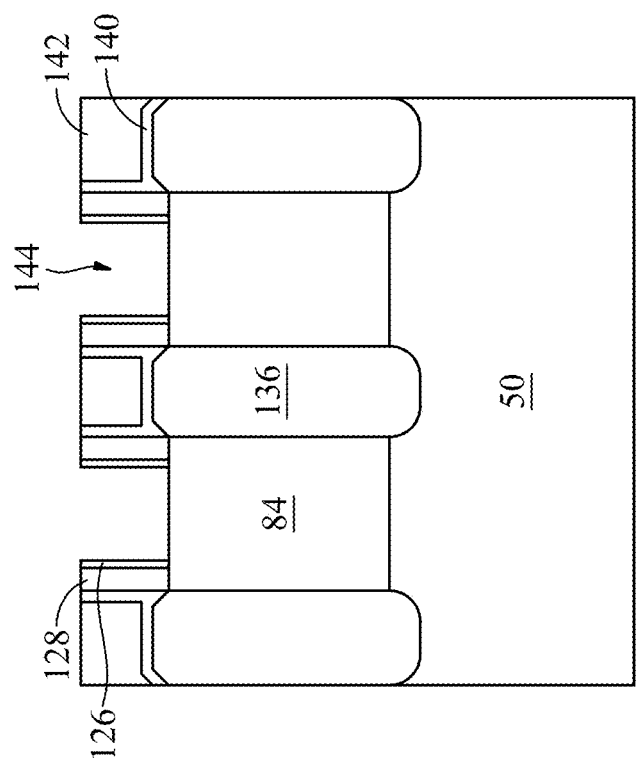

In FIGS. 24A-24C, the second semiconductor layers 54A-54C are removed from the regions 50N, extending the second recesses 144. The second semiconductor layers 54A-54C may be removed by an isotropic etching process such as wet etching or the like. The second semiconductor layers 54A-54C may be removed using etchants which are selective to the materials of the second semiconductor layers 54A-54C, while the first semiconductor layers 52A-52D and the first epitaxial semiconductor material 84 remain relatively unetched as compared to the second semiconductor layers 54A-54C. In an embodiment in which the second semiconductor layers 54A-54C include, e.g., SiGe, and the first semiconductor layers 52A-52D include, e.g., Si or SiC, a solution including hydrofluoric acid (HF) and hydrogen peroxide ($H_2O_2$), a solution including hydrofluoric acid, nitric acid ($HNO_3$), and water ($H_2O$), or the like may be used to remove the second semiconductor layers 54A-54C. In further embodiments, tetramethylammonium hydroxide (TMAH), ammonium hydroxide ($NH_4OH$), or the like may be used to remove the second semiconductor layers 54A-54C.

Figure 25A:
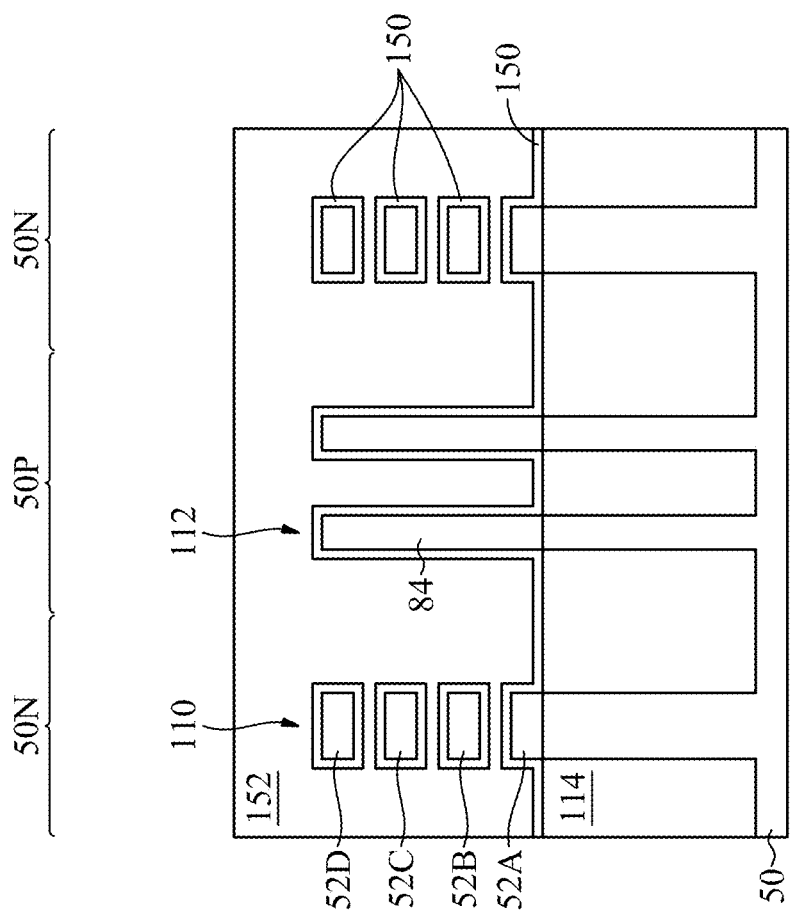
Figure 25B:
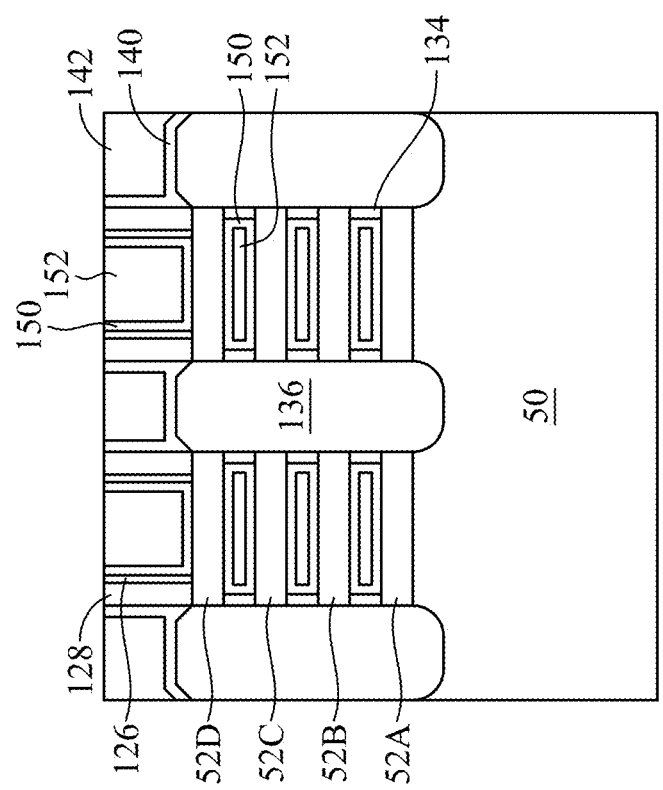
Figure 25C:
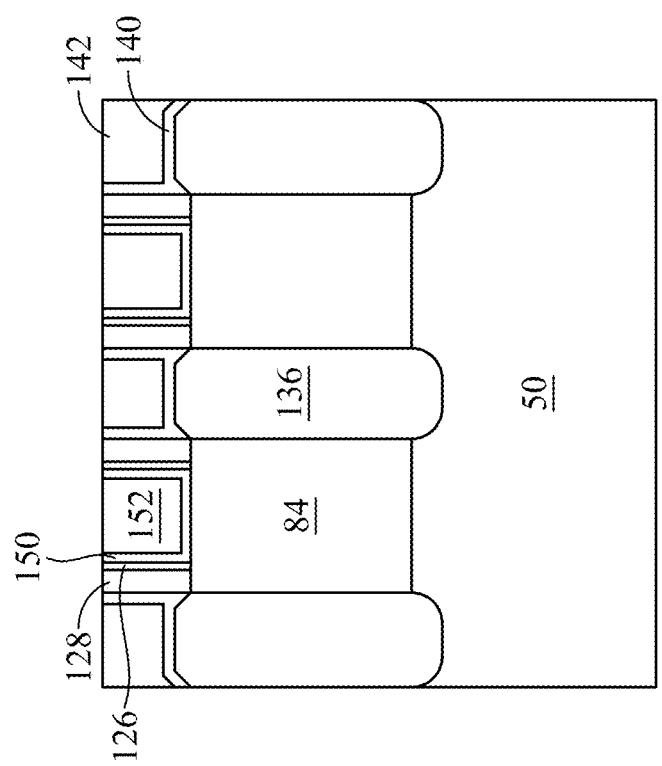

In FIGS. 25A-25C, gate dielectric layers 150 and gate electrodes 152 are formed for replacement gates. The gate dielectric layers 150 are deposited conformally in the second recesses 144, such as on top surfaces and sidewalls of the first semiconductor layer 52A and the first epitaxial semiconductor material 84 and on top surfaces, sidewalls, and bottom surfaces of the first semiconductor layers 52B-52D. The gate dielectric layers 150 may also be deposited on top surfaces of the first ILD 142. In accordance with some embodiments, the gate dielectric layers 150 comprise silicon oxide, silicon nitride, or multilayers thereof. In some embodiments, the gate dielectric layers 150 include a high-k dielectric material, and in these embodiments, the gate dielectric layers 150 may have a k value greater than about 7.0, and may include a metal oxide or a silicate of hafnium, aluminum, zirconium, lanthanum, manganese, barium, titanium, lead, and combinations thereof. The formation methods of the gate dielectric layers 150 may include molecular-beam deposition (MBD), ALD, PECVD, and the like.

The gate electrodes 152 are deposited over the gate dielectric layers 150, respectively, and fill the remaining portions of the second recesses 144. The gate electrodes 152 may include a metal-containing material such as titanium nitride, titanium oxide, tantalum nitride, tantalum carbide, cobalt, ruthenium, aluminum, tungsten, combinations thereof, or multi-layers thereof. For example, although single layer gate electrodes 152 are illustrated in FIGS. 25A-25C, the gate electrodes 152 may comprise any number of liner layers, any number of work function tuning layers, and a fill material. After the filling of the second recesses 144, a planarization process, such as a CMP, may be performed to remove the excess portions of the gate dielectric layers 150 and the material of the gate electrodes 152, which excess portions are over the top surface of the first ILD 142. The remaining portions of material of the gate electrodes 152 and the gate dielectric layers 150 thus form replacement gates of the resulting NSFETs and FinFETs. The gate electrodes 152 and the gate dielectric layers 150 may be collectively referred to as a "gate stack." The gate stacks may surround each of the first semiconductor layers 52B-52D and along the top surfaces and sidewalls of the first semiconductor layer 52A and the first epitaxial semiconductor material 84.

The formation of the gate dielectric layers 150 in the regions 50N and the region 50P may occur simultaneously such that the gate dielectric layers 150 in each region are formed from the same materials, and the formation of the gate electrodes 152 may occur simultaneously such that the gate electrodes 152 in each region are formed from the same materials. In some embodiments, the gate dielectric layers 150 in each region may be formed by distinct processes, such that the gate dielectric layers 150 may be different materials, and/or the gate electrodes 152 in each region may be formed by distinct processes, such that the gate electrodes 152 may be different materials. Various masking steps may be used to mask and expose appropriate regions when using distinct processes.

Figure 26A:
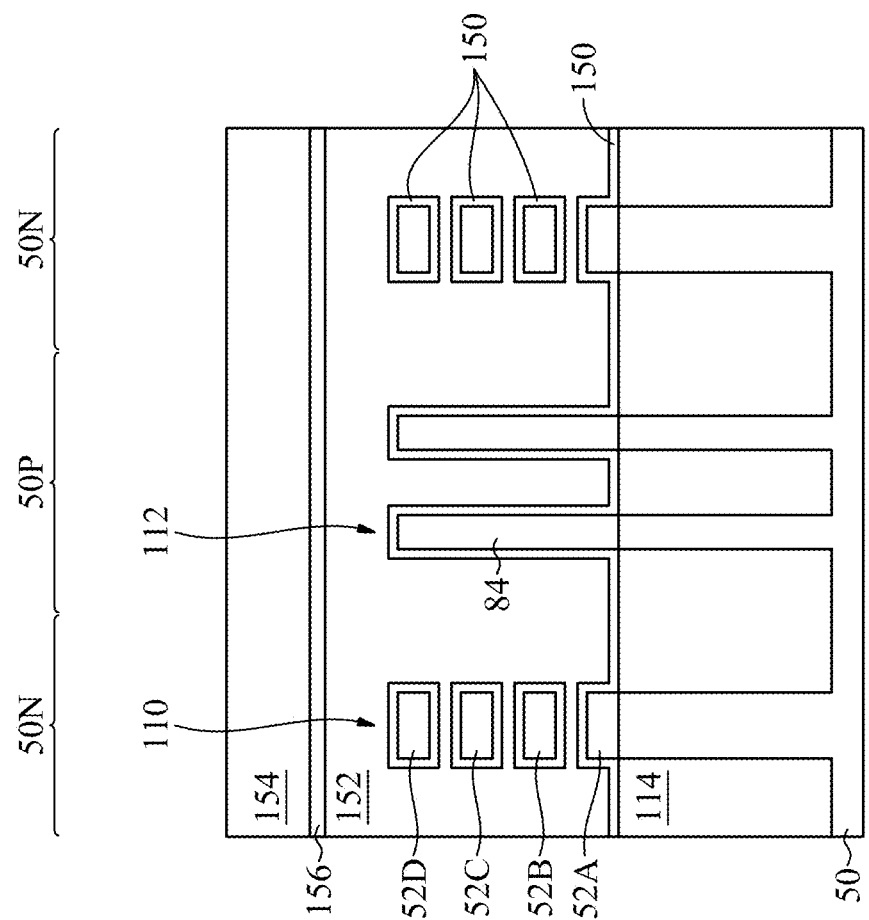
Figure 26B:
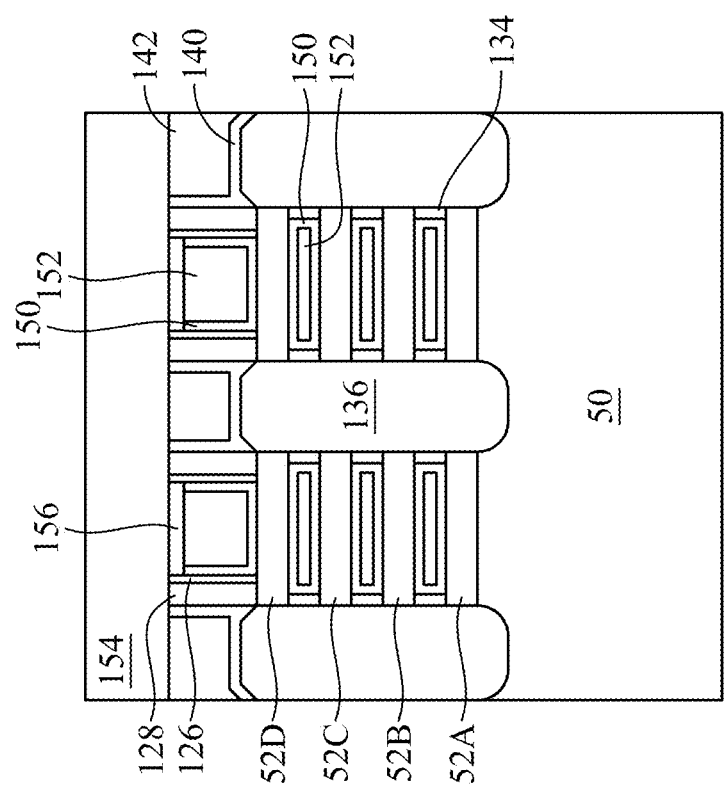
Figure 26C:
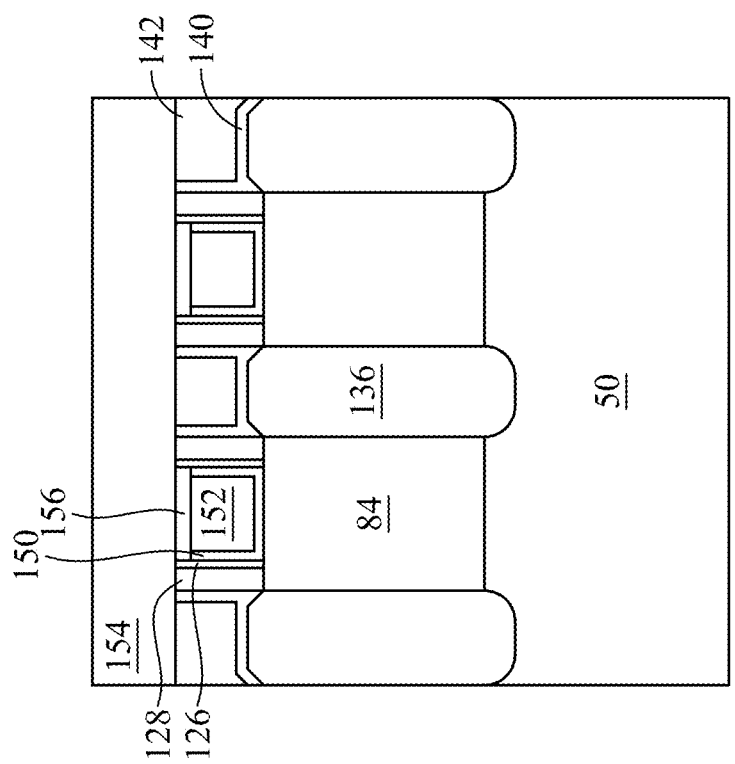

In FIGS. 26A-26C, a second ILD 154 is deposited over the first ILD 142. In some embodiments, the second ILD 154 is a flowable film formed by FCVD. In some embodiments, the second ILD 154 is formed of a dielectric material such as PSG, BSG, BPSG, USG, or the like, and may be deposited by any suitable method, such as CVD, PECVD, or the like. In accordance with some embodiments, before the formation of the second ILD 154, the gate stack (including the gate dielectric layers 150 and the corresponding overlying gate electrodes 152) is recessed, so that a recess is formed directly over the gate stack and between opposing portions of gate seal spacers 126. A gate mask 156 comprising one or more layers of dielectric material, such as silicon nitride, silicon oxynitride, or the like, is filled in the recess, followed by a planarization process to remove excess portions of the dielectric material extending over the first ILD 142. Subsequently formed gate contacts (such as the gate contacts 158, discussed below with respect to FIGS. 27A-27C) penetrate through the gate mask 156 to contact the top surface of the recessed gate electrodes 152.

Figure 27A:
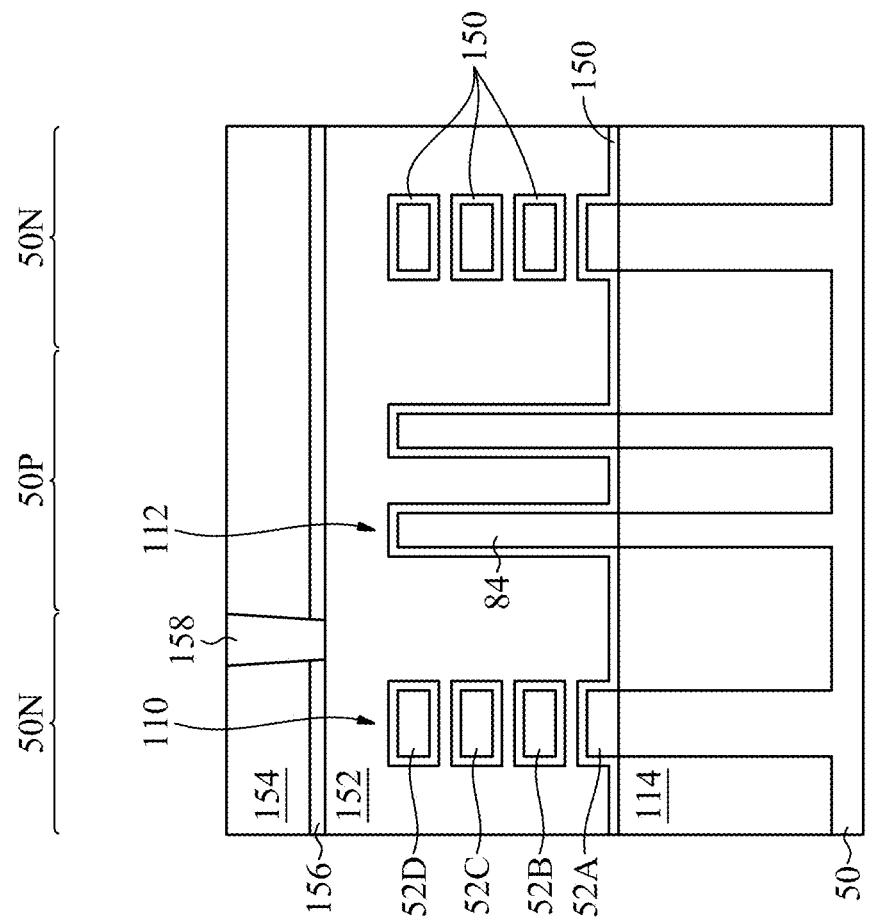
Figure 27B:
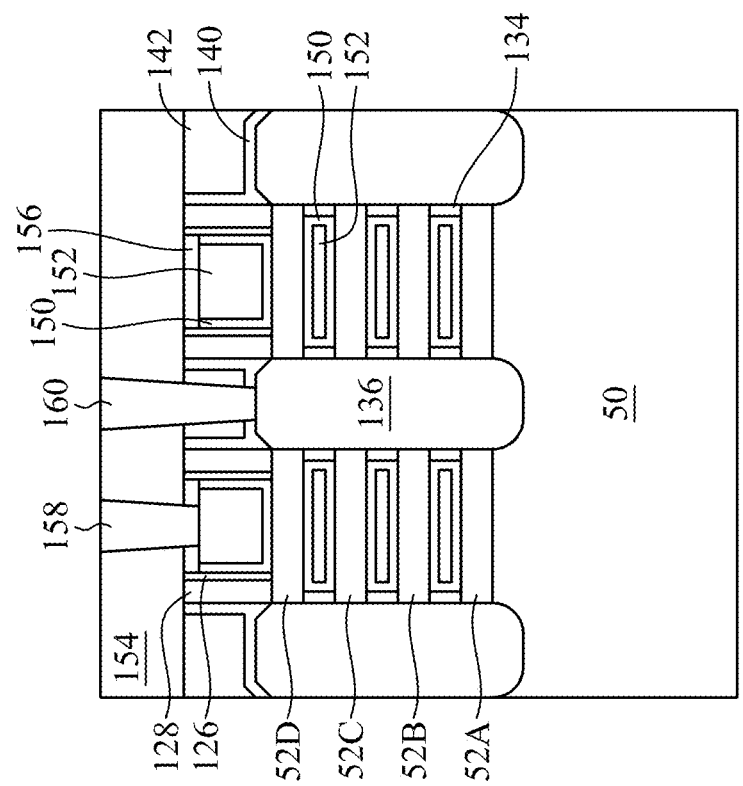
Figure 27C:
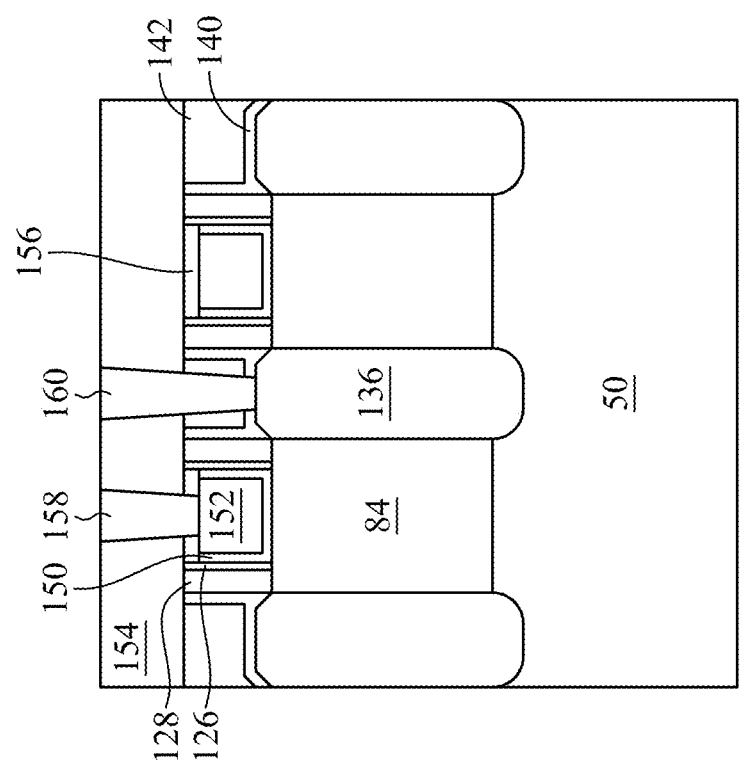

In FIGS. 27A-27C, gate contacts 158 and source/drain contacts 160 are formed. Openings for the source/drain contacts 160 are formed through the second ILD 154 and the first ILD 142, and openings for the gate contacts 158 are formed through the second ILD 154 and the gate mask 156. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 154. The remaining liner and conductive material form the source/drain contacts 160 and gate contacts 158 in the openings. An anneal process may be performed to form a silicide at the interface between the epitaxial source/drain regions 136 and the source/drain contacts 160. The source/drain contacts 160 are physically and electrically coupled to the epitaxial source/drain regions 136, and the gate contacts 158 are physically and electrically coupled to the gate electrodes 152. The source/drain contacts 160 and the gate contacts 158 may be formed in different processes, or may be formed in the same process. Although shown as being formed in the same cross-sections, it should be appreciated that each of the source/drain contacts 160 and the gate contacts 158 may be formed in different cross-sections, which may avoid shorting of the contacts.

Figure 28A:
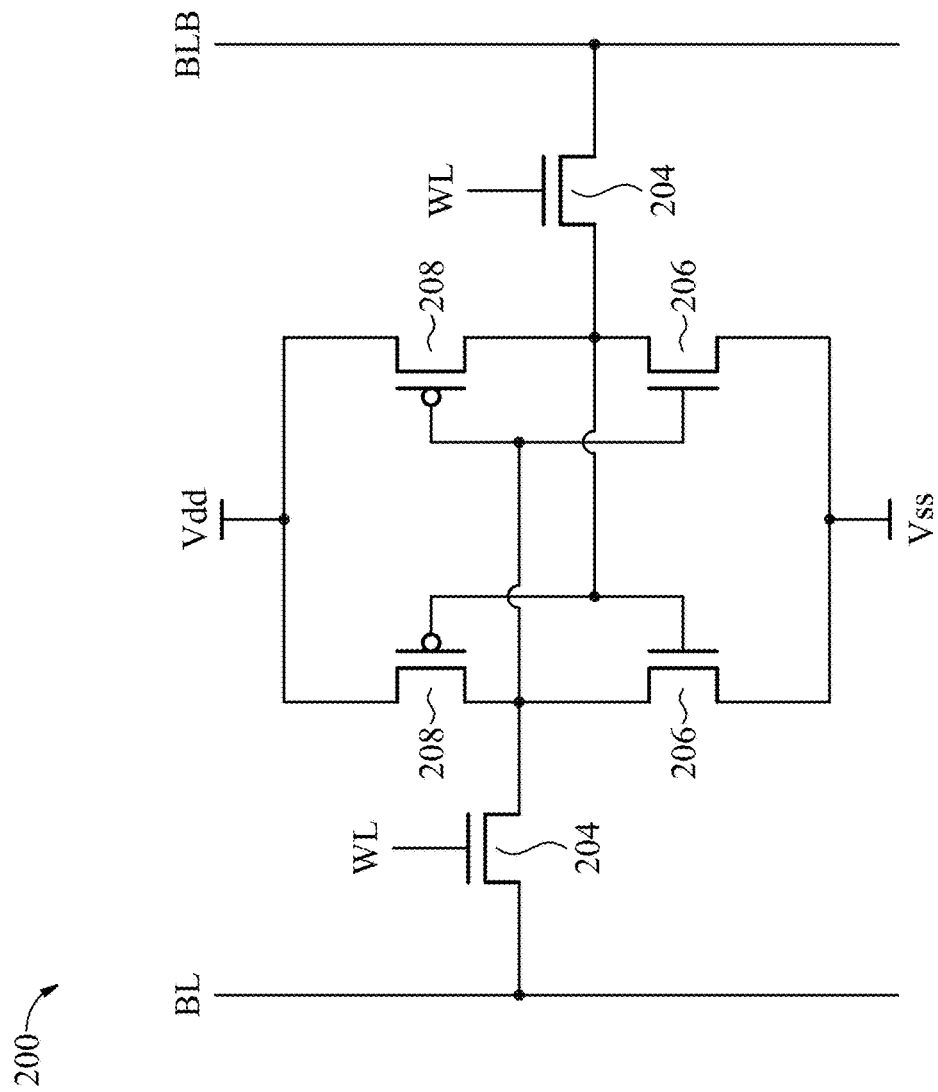
FIGS. 28A-30B illustrate circuit diagrams and layouts of static random access memory (SRAM) cells, in accordance with some embodiments.
Figure 28B:
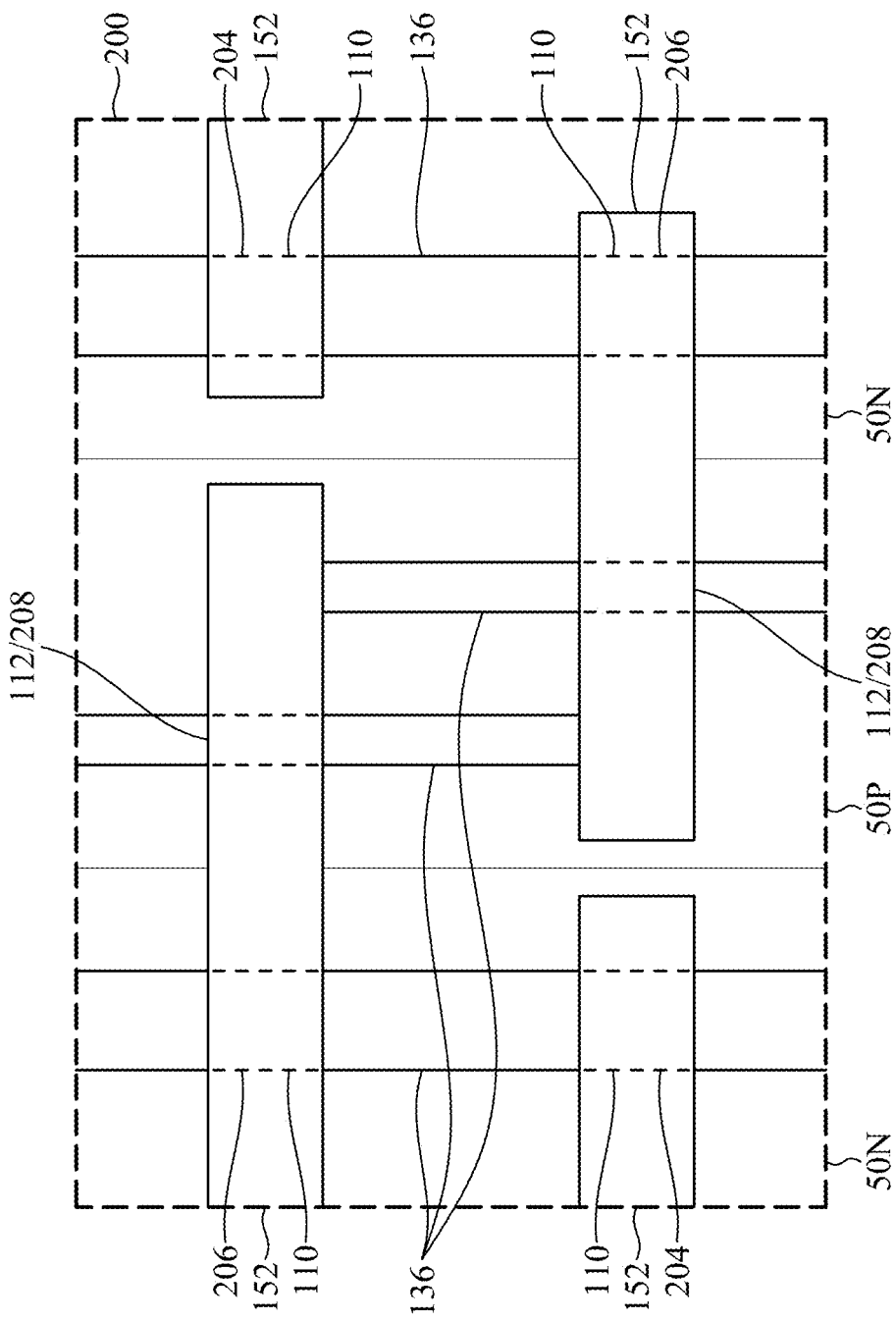

FIGS. 28A and 28B illustrate a circuit diagram and a layout of a six-transistor (6-T) single-port SRAM cell 200, which includes pull-up transistors 208, pull-down transistors 206, and pass-gate transistors 204. Bit-lines BL and BLB and a word line WL are connected to the 6-T SRAM cell 200. The operation of the 6-T SRAM cell is known in the art, and hence is not discussed herein.

As illustrated in FIG. 28B, the epitaxial source/drain regions 136 are active regions of the pull-up transistors 208, the pull-down transistors 206, and the pass-gate transistors 204, which are used to form source and drain regions of the respective transistors. The nanostructures 110 may form channels of the pass-gate transistors 204, while the fins 112 form channels of the pull-up transistors 208, such that the pass-gate transistors 204 have higher drive strength than the pull-up transistors 208, increasing the alpha ratio, increasing cell stability, and decreasing write times. The nanostructures 110 may also form channels of the pull-down transistors 206 such that the pull-down transistors 206 have relatively high drive strength, which decreases read access time. As such, using the nanostructures 110 for channels of the pass-gate transistors 204 and the pull-down transistors 206 and using the fins 112 for channels of the pull-up transistors 208 improves read access time and write access time. The pull-down transistors 206 and the pass-gate transistors 204 are disposed in the regions 50N and the pull-up transistors 208 are disposed in the region 50P. The gate electrodes 152 may extend over each of the pull-up transistors 208, the pull-down transistors 206, and the pass-gate transistors 204.

Figure 29A:
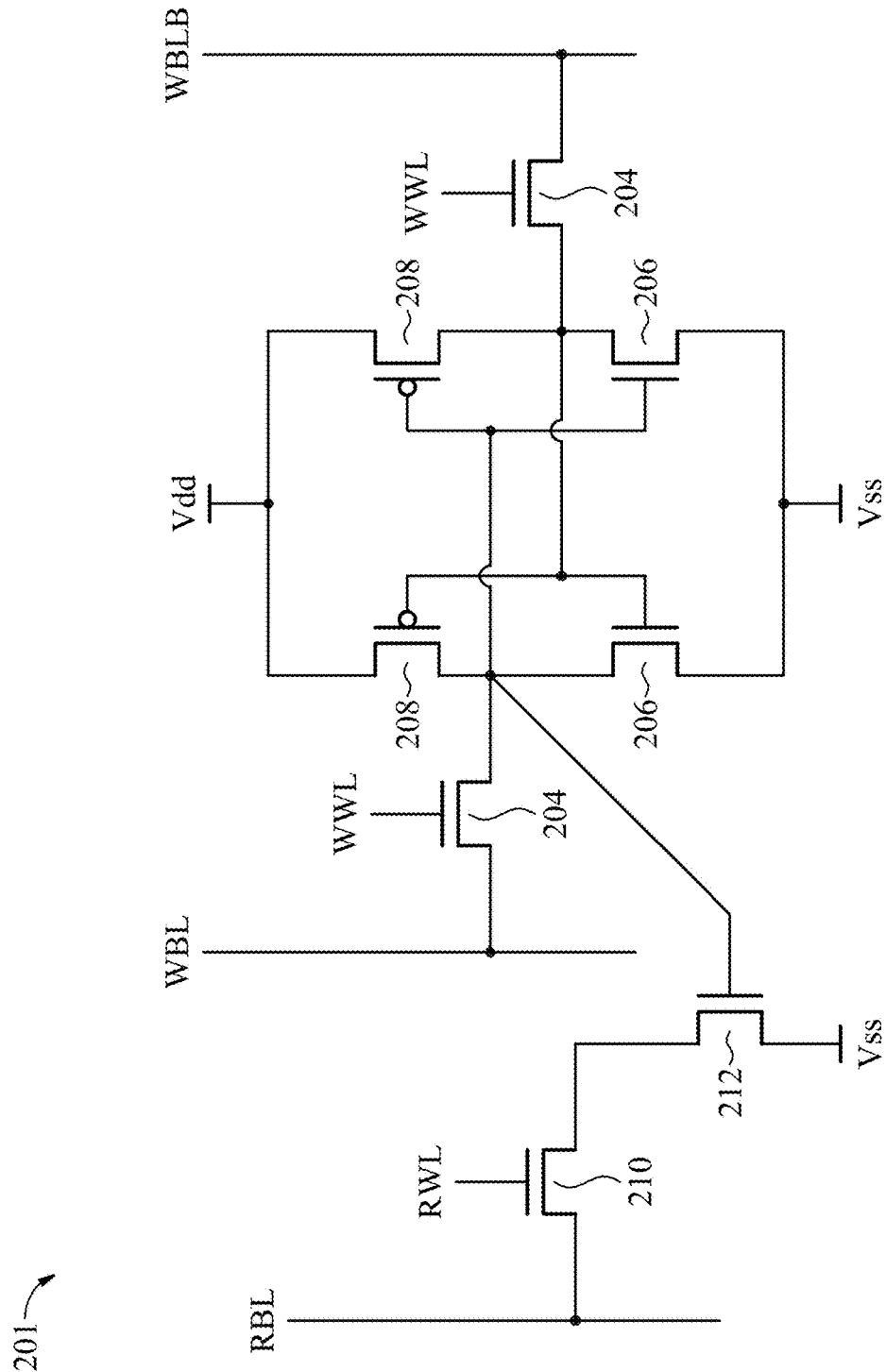
Figure 29B:
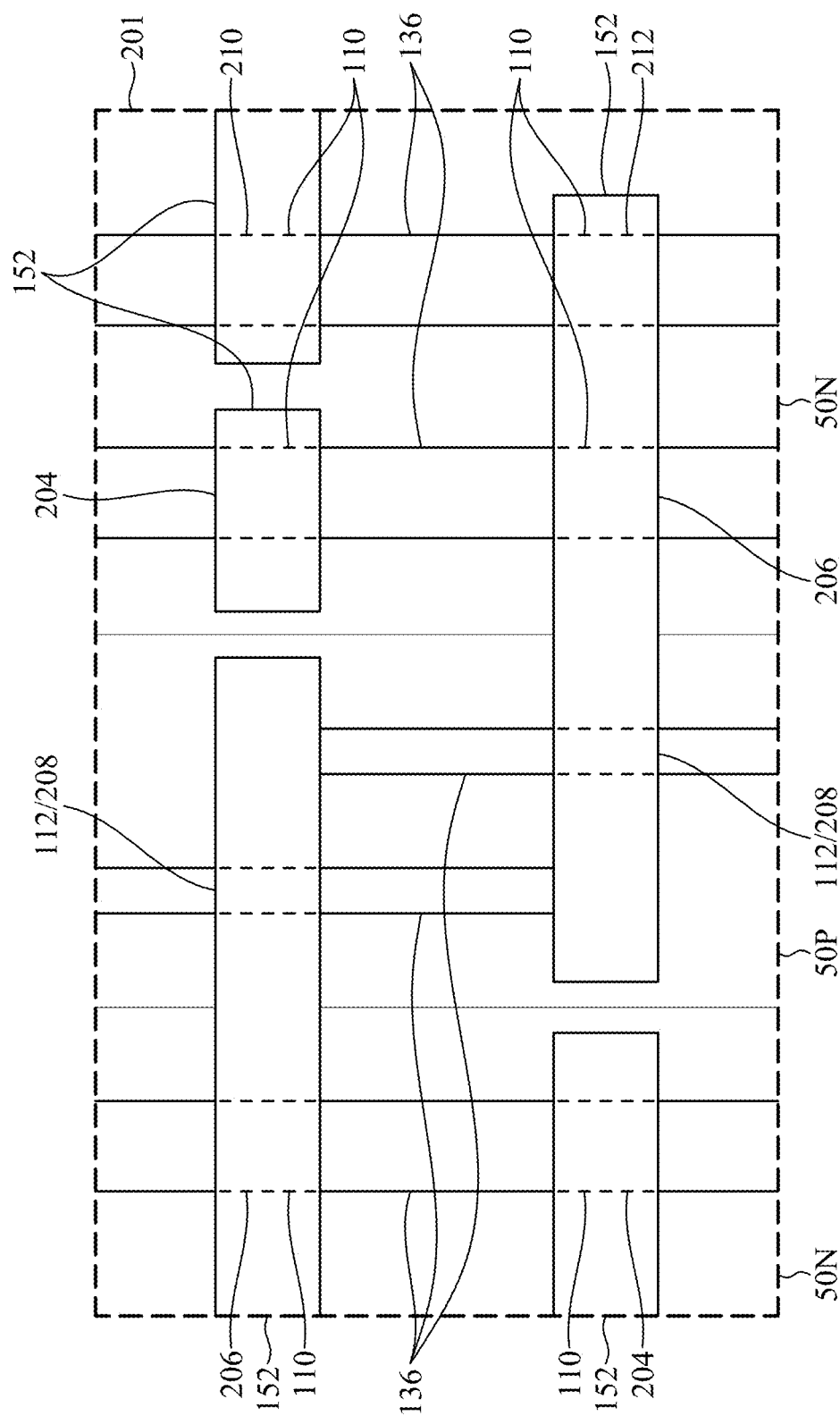

FIGS. 29A and 29B illustrate a circuit diagram and a layout of an eight-transistor (8-T) dual-port SRAM cell 201, which, besides pull-up transistors 208, pull-down transistors 206, and pass-gate transistors 204, also includes a read pass-gate transistor 210 and a read pull-down transistor 212. A read bit-line RBL, write bit-lines WBL and WBLB, a read word-line RWL, and a write word-line WWL are connected to the 8-T dual-port SRAM cell 201. As illustrated in FIG. 29B, the read pass-gate transistor 210 and the read pull-down transistor 212 are disposed in the regions 50N. The nanostructures 110 form channels of the read pass-gate transistor 210 and the read pull-down transistor 212, which provides for faster read access times. Moreover, because the read pass-gate transistor 210 and the read pull-down transistor 212 are connected between the read bit-line RBL and the pull-up transistors 208 and the pull-down transistors 206, smaller loads are placed on the pull-up transistors 208 and the pull-down transistors 206 such that a lower minimum power supply voltage ($V_{ccmin}$) can be used. The nanostructures 110 may be used for channels of the pass-gate transistors 204 and the pull-down transistors 206 and the fins 112 may be used for channels of the pull-up transistors 208 for the same reasons discussed above with respect to the 6-T single-port SRAM cell 200.

Figure 30A:
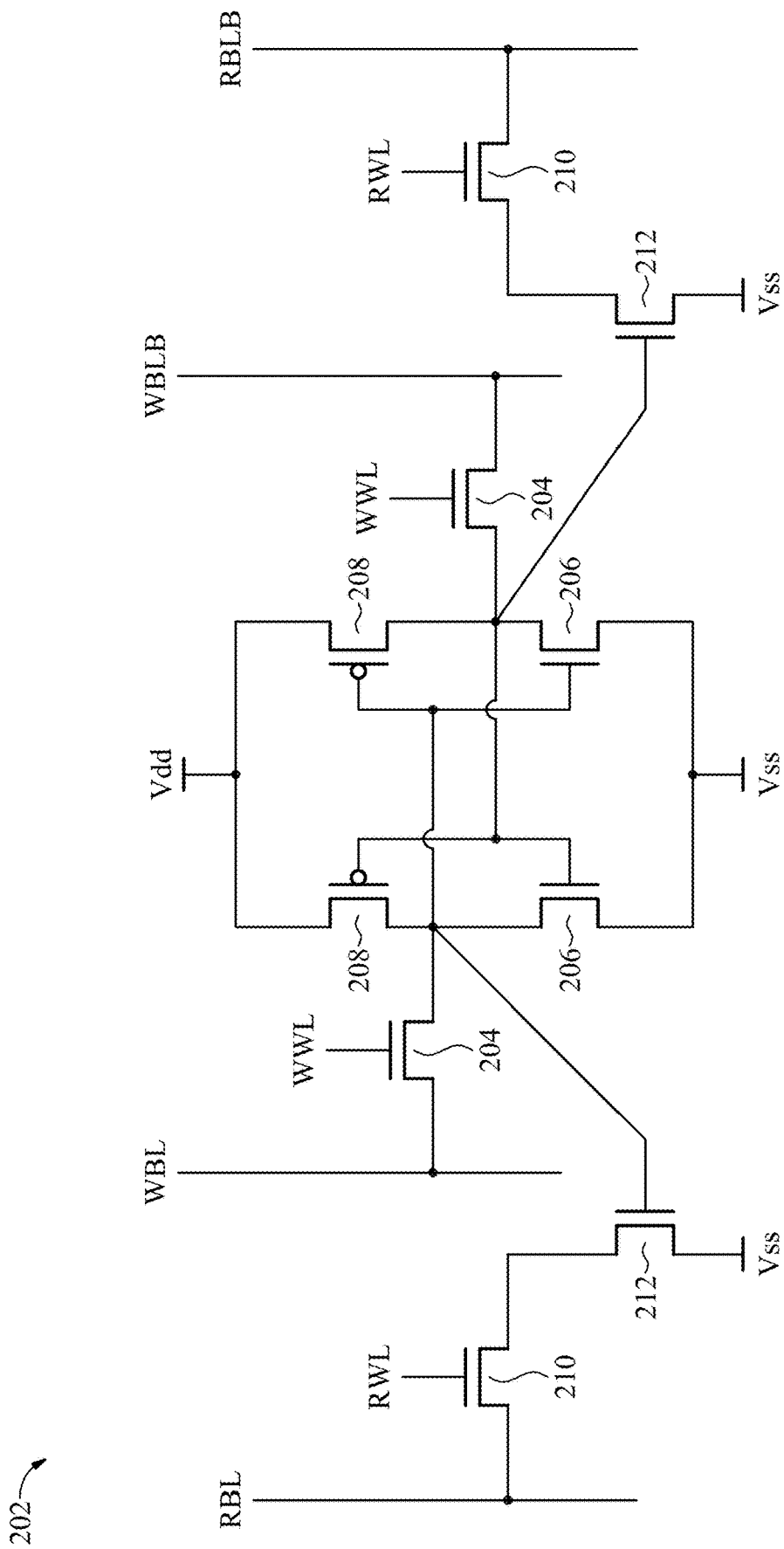
Figure 30B:
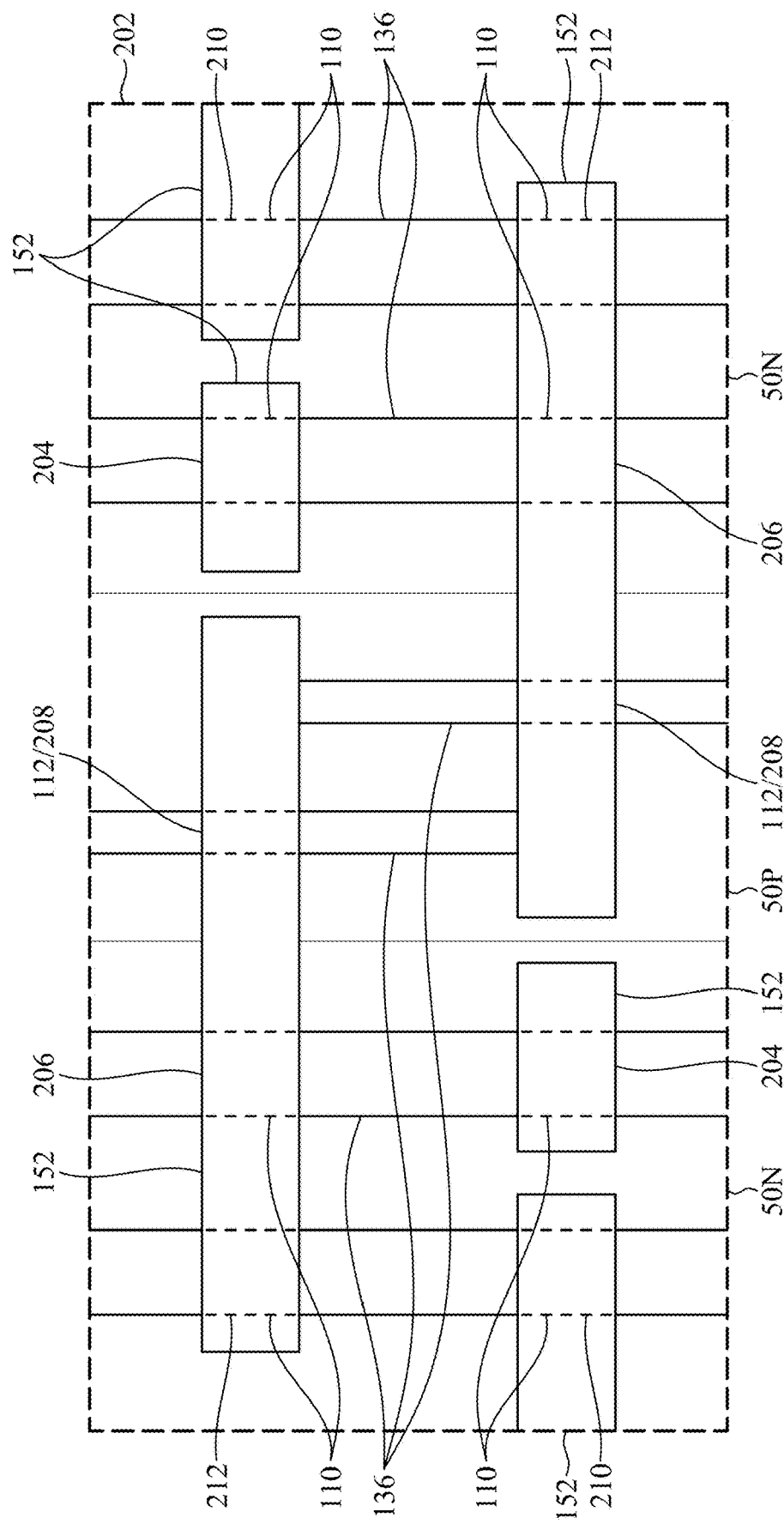

FIGS. 30A and 30B illustrate a circuit diagram and a layout of a ten-transistor (10-T) dual-port SRAM cell 202, which, includes two each of pull-up transistors 208, pull-down transistors 206, pass-gate transistors 204, read pass-gate transistors 210, and read pull-down transistor 212. Read bit-lines RBL and RBLB, write bit-lines WBL and WBLB, a read word-line RWL, and a write word-line WWL are connected to the 10-T dual-port SRAM cell 202. As illustrated in FIG. 30B, the read pass-gate transistors 210 and the read pull-down transistors 212 are disposed in the regions 50N. The nanostructures 110 may be used for channels of the pass-gate transistors 204, the pull-down transistors 206, the read pass-gate transistors 210, and the read pull-down transistors 212 and the fins 112 may be used for channels of the pull-up transistors 208 for the same reasons discussed above with respect to the 8-T dual-port SRAM cell 201.

As discussed previously, nanostructures 110 may be provided in the regions 50N to provide transistors having relatively high drive current, which increases performance and speed of the semiconductor devices. The fins 112 provided in the region 50P may have widths less than the nanostructures 110 and may be used to decrease cell size and provide transistors having relatively low drive current. The fins 112 may also have better N-well/P-well boundaries and may reduce leakage and latch-up issues. Including both the nanostructures 110 and the fins 112 results in faster SRAM operation, reduced cell size (in comparison the SRAM cells including nanostructures only), better cell current, smaller threshold voltage ($V_t$) mismatch, and lower minimum power supply voltage ($V_{ccmin}$).

In accordance with an embodiment, a semiconductor device includes a first memory cell, the first memory cell including a first transistor including a first channel region, the first channel region including a first plurality of semiconductor nanostructures; and a second transistor including a second channel region, the second channel region including a semiconductor fin. In an embodiment, the first transistor includes a pull-down transistor and the second transistor includes a pull-up transistor. In an embodiment, the first memory cell further includes a third transistor including a third channel region, the third channel region including a second plurality of semiconductor nanostructures, the third transistor including a pass-gate transistor. In an embodiment, the first transistor and the third transistor are disposed in an NMOS region over a semiconductor substrate, and the second transistor is disposed in a PMOS region over the semiconductor substrate. In an embodiment, the first memory cell further includes a fourth transistor including a fourth channel region, the fourth channel region including a third plurality of semiconductor nanostructures, the fourth transistor including a read pull-down transistor; and a fifth transistor including a fifth channel region, the fifth channel region including a fourth plurality of semiconductor nanostructures, the fifth transistor including a read pass-gate transistor. In an embodiment, a ratio of a width of the first channel region in a direction of a current flow across the first channel region to a width of the second channel region in a direction of a current flow across the second channel region is from 3 to 8.

In accordance with another embodiment a method includes forming a multi-layer semiconductor stack over a semiconductor substrate, the multi-layer semiconductor stack including alternating layers of a first semiconductor material and a second semiconductor material different from the first semiconductor material; etching the multi-layer semiconductor stack to form a first opening exposing the semiconductor substrate; forming a third semiconductor material filling the first opening; etching the multi-layer semiconductor stack and the semiconductor substrate to form a first nanostructure extending from the semiconductor substrate; and etching the third semiconductor material and the semiconductor substrate to form a first fin extending from the semiconductor substrate. In an embodiment, the method further includes forming one or more first recesses by etching the multi-layer semiconductor stack to remove the alternating layers of the multi-layer semiconductor stack including the second semiconductor material, the first semiconductor material and the third semiconductor material including silicon, and the second semiconductor material including silicon germanium. In an embodiment, the method further includes forming a gate stack filling the first recesses and extending along top surfaces and sidewalls of the first nanostructure and the first fin. In an embodiment, the method further includes planarizing the multi-layer semiconductor stack and the third semiconductor material, a top surface of the first nanostructure being level with a top surface of the first fin. In an embodiment, etching the multi-layer semiconductor stack and the semiconductor substrate to form the first nanostructure and etching the third semiconductor material and the semiconductor substrate to form the first fin are performed simultaneously. In an embodiment, the method further includes forming a dummy gate over the first nanostructure and the first fin; etching the first nanostructure to form a first recess adjacent the dummy gate; etching the first fin to form a second recess adjacent the dummy gate; epitaxially growing a first source/drain region in the first recess; and epitaxially growing a second source/drain region in the second recess. In an embodiment, etching the first nanostructure and etching the first fin are performed simultaneously and epitaxially growing the first source/drain region and epitaxially growing the second source/drain region are performed simultaneously.

In accordance with yet another embodiment a semiconductor device includes a first nanostructure extending from a semiconductor substrate in a first region of the semiconductor substrate, the first nanostructure including a plurality of semiconductor layers over the semiconductor substrate; a first fin extending from the semiconductor substrate in a second region of the semiconductor substrate, the first fin including a semiconductor material over the semiconductor substrate, the semiconductor material having a constant composition, a top surface of the semiconductor material being level with a top surface of a topmost semiconductor layer of the plurality of semiconductor layers, a bottom surface of the semiconductor material being level with a bottom surface of a bottommost semiconductor layer of the plurality of semiconductor layers; and a gate stack extending over the first nanostructure and the first fin. In an embodiment, the gate stack extends along the top surface, sidewalls, and a bottom surface of the topmost semiconductor layer, the gate stack extends along a top surface and sidewalls of the bottommost semiconductor layer, and the gate stack extends along the top surface and sidewalls of the semiconductor material. In an embodiment, the first region includes an NMOS region and the second region includes a PMOS region. In an embodiment, a ratio of a first width of the first nanostructure to a second width of the first fin is from 3 to 8. In an embodiment, the semiconductor material and each semiconductor layer of the plurality of semiconductor layers include silicon. In an embodiment, the semiconductor device further includes a first epitaxial source/drain region adjacent the gate stack, the first epitaxial source/drain region contacting the semiconductor layers of the plurality of semiconductor layers; and a second epitaxial source/drain region adjacent the gate stack, the second epitaxial source/drain region contacting the semiconductor material. In an embodiment, the semiconductor device further includes inner spacers extending between adjacent semiconductor layers of the plurality of semiconductor layers, the inner spacers separating the first epitaxial source/drain region from the gate stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory cell comprising:
   a substrate;
   at least two pull-up transistors, wherein a first pull-up transistor of the at least two pull-up transistors is a finFET transistor that includes:
   a semiconductor material extending above the substrate in a first horizontal direction along the substrate and extending vertically continuously to a first height above the substrate; and
   a gate electrode extending in a second horizontal direction perpendicular to the first horizontal direction over a top and sidewalls of the semiconductor material;
   at least two pull-down transistors, wherein a first pull-down transistor of the at least two pull-down transistors is a nanosheet FET transistor (NFET) that includes:
   a stacked semiconductor channel region extending in the first horizontal direction, individual semiconductor channel regions of the stacked semiconductor channel region being stacked vertically above the substrate and being separated by respective portions of the gate electrode;
   a source/drain region adjacent the stacked semiconductor channel region, the source/drain region extending from the substrate and including dopants of a first conductivity type;
   an anti-punch-through region in the substrate and underlying the stacked semiconductor channel region and the source/drain region, the anti-punch-through region including dopants of a second conductivity type, the second conductivity type being opposite the first conductivity type; and
   at least two pass-gate transistors, wherein a first pass-gate transistor of the at least two pass-gate transistors is an NFET that includes:
   a second stacked semiconductor channel region extending in the first horizontal direction, individual semiconductor channel regions of the second stacked semiconductor channel region being stacked vertically above the substrate and being separated by respective portions of a second gate electrode, wherein the anti-punch-through region extends under the second stacked semiconductor channel region.

2. The memory cell of claim 1, wherein the anti-punch-through region has doping concentration of from $1 \times 10^{13}$ atoms/cm$^3$ to $1 \times 10^{14}$ atoms/cm$^3$.

3. The memory cell of claim 1, further comprising a first source/drain region extending from the stacked semiconductor channel region of a first pull-down transistor of the at least two pull-down transistors to the second stacked semiconductor channel region of a first pass-gate transistor of the at least two pass-gate transistors.

4. The memory cell of claim 1, wherein the semiconductor material of a first pull-up transistor of the at least two pull-up transistors is between the stacked semiconductor channel region of a first pull-down transistor of the at least two pull-down transistors and the second stacked semiconductor channel region of a first pass-gate transistor of the at least two pass-gate transistors.

5. The memory cell of claim 1, wherein the stacked semiconductor channel region and the second stacked semiconductor channel region comprise the same material.

6. The memory cell of claim 1, further comprising:
   a read pass-gate transistor including a third stacked semiconductor channel region extending in the first horizontal direction, individual semiconductor channel regions of the third stacked semiconductor channel region being stacked vertically above the substrate and being separated by respective portions of gate electrode material; and a read pull-down transistor including a fourth stacked semiconductor channel region extending in the first horizontal direction.

7. The memory cell of claim 6, wherein the stacked semiconductor channel region of a first pull-down transistor of the at least two pull-down transistors is interjacent the semiconductor material of a first pull-up transistor of the at least two pull-up transistors and the third stacked semiconductor channel region of the read pass-gate transistor.

8. The memory cell of claim 6, further comprising:
a second read pass-gate transistor including a fourth stacked semiconductor channel region extending in the first horizontal direction, individual semiconductor channel regions of the fourth stacked semiconductor channel region being stacked vertically above the substrate and being separated by respective portions of gate electrode material; and
a second read pull-down transistor including a fifth stacked semiconductor channel region extending in the first horizontal direction.

9. A memory cell comprising:
a substrate;
an isolation material overlying the substrate and having a top surface;
a first pull-up transistor including:
a first semiconductor fin extending in a first longitudinal direction along the substrate and extending a first height above the top surface of the isolation material, the first semiconductor fin being continuous semiconductor material throughout the first height;
a source/drain region adjacent the first semiconductor fin, the source/drain region being doped with dopant of a first conductivity type; and
a first gate electrode extending in a second longitudinal direction perpendicular to the first longitudinal direction over a top and sidewalls of the first semiconductor fin;
a first pull-down transistor including:
a first plurality of semiconductor channel regions, individual semiconductor channel regions of the first plurality of semiconductor channel regions being vertically stacked to the first height above the top surface of the isolation material, and being separated by portions of the first gate electrode, wherein the first gate electrode also extends over the first plurality of semiconductor channel regions;
a second pull-up transistor including:
a second semiconductor fin extending in the first longitudinal direction along the substrate and extending the first height above the top surface of the isolation material, the second semiconductor fin being continuous semiconductor material throughout the first height; and
a second gate electrode extending in the second longitudinal direction over a top and sidewalls of the second semiconductor fin; and
a second pull-down transistor including:
a second plurality of semiconductor channel regions, individual semiconductor channel regions of the second plurality of semiconductor channel regions being vertically stacked to the first height above the top surface of the isolation material, and being separated by portions of the second gate electrode, wherein the second gate electrode also extends over the second plurality of semiconductor channel regions; and an anti-punch-through region at a top of the substrate, the anti-punch-through region extending continuously under the first semiconductor fin and the first plurality of semiconductor channel regions and being doped with a dopant of a second conductivity type.

10. The memory cell of claim 9, further comprising:
a first pass transistor including a third plurality of semiconductor channel regions, individual semiconductor channel regions of the third plurality of semiconductor channel regions being separated by a third gate electrode, wherein the third gate electrode is aligned to and laterally spaced from the first gate electrode in the second longitudinal direction; and
a second pass transistor including a fourth plurality of semiconductor channel regions, individual semiconductor channel regions of the fourth plurality of semiconductor channel regions being vertically stacked to the first height above the top surface of the isolation material, and being separated by a fourth gate electrode, wherein the fourth gate electrode is aligned to and laterally spaced from the second gate electrode in the second longitudinal direction.

11. The memory cell of claim 10, wherein the first semiconductor fin is interjacent the first plurality of semiconductor channel regions and the third plurality of semiconductor channel regions, and wherein the second semiconductor fin is interjacent the second plurality of semiconductor channel regions and the fourth plurality of semiconductor channel regions.

12. The memory cell of claim 10, further comprising:
a read-pass transistor including a fifth plurality of semiconductor channel regions, individual semiconductor channel regions of the fifth plurality of semiconductor channel regions being separated by a fifth gate electrode, the fifth gate electrode being aligned to and laterally spaced from the third gate electrode in the second longitudinal direction; and
a read pull-down transistor including a sixth plurality of semiconductor channel regions, individual semiconductor channel regions of the sixth plurality of semiconductor channel regions being separated by the second gate electrode.

13. The memory cell of claim 10, further comprising:
a first read-pass transistor including a fifth plurality of semiconductor channel regions, individual semiconductor channel regions of the fifth plurality of semiconductor channel regions being separated by a fifth gate electrode, the fifth gate electrode being aligned to and laterally spaced from the third gate electrode in the second longitudinal direction;
a first read pull-down transistor including a sixth plurality of semiconductor channel regions, individual semiconductor channel regions of the sixth plurality of semiconductor channel regions being separated by the second gate electrode;
a second read-pass transistor including a seventh plurality of semiconductor channel regions, individual semiconductor channel regions of the seventh plurality of semiconductor channel regions being separated by the first gate electrode; and
a second read pull-down transistor including an eighth plurality of semiconductor channel regions, individual semiconductor channel regions of the eighth plurality of semiconductor channel regions being separated by the second gate electrode.

14. The memory cell of claim 9, wherein the first plurality of semiconductor channel regions and the second plurality of semiconductor channel regions are comprised of the same material.

15. The memory cell of claim 10, wherein the first pass transistor has a higher drive strength than does the first pull-up transistor, and the second pass transistor has a higher drive strength than does the second pull-up transistor.

16. A memory cell comprising:
a substrate;
a first fin-FET transistor configured as a pull-up transistor of the memory cell, and including a first fin structure, a first source/drain region, a second source/drain region, a first channel region within the first fin structure and between the first source/drain region and the second source/drain region, and a first gate electrode overlying the first channel region;
a first nanostructure transistor configured as a first pull-down transistor of the memory cell, and including a third source/drain region, a fourth source/drain region, a first stack of channel regions between the third source/drain region and the fourth source/drain region, and the first gate electrode interjacent individual channel regions of the first stack of channel regions;
a second fin-FET transistor configured as a second pull-up transistor of the memory cell, and including a second fin structure, a fifth source/drain region, a sixth source/drain region, a second channel region within the second fin structure and between the fifth source/drain region and the sixth source/drain region, and a second gate electrode, parallel to and spaced apart from the first gate electrode, overlying the second channel region;
a second nanostructure transistor configured as a second pull-down transistor of the memory cell, and including a seventh source/drain region, an eighth source/drain region, a second stack of channel regions between the seventh source/drain region and the eighth source/drain region, and the second gate electrode interjacent individual channel regions of the second stack of channel regions;
a third nanostructure transistor configured as a first pass transistor of the memory cell, and including the seventh source/drain region, a ninth source/drain region, a third stack of channel regions between the seventh source/drain region and the ninth source/drain region, and a third gate electrode, aligned with and spaced apart from the first gate electrode, interjacent individual channel regions of the third stack of channel regions; and
a fourth nanostructure transistor configured as a second pass transistor of the memory cell, and including the fourth source/drain region, a tenth source/drain region, a fourth stack of channel regions between the fourth source/drain region and the tenth source/drain region, and a fourth gate electrode, aligned with and spaced apart from the second gate electrode, interjacent individual channel regions of the fourth stack of channel regions; and
wherein the substrate includes a doped anti-punch-through region extending under the first and second fin-FET transistors and under the first, second, third, and fourth nanostructure transistors, the doped anti-punch through region configured to reduce leakage current from the memory cell relative to a memory cell without the doped anti-punch-through region.

17. The memory cell of claim 16, wherein the first fin structure is between the first stack of channel regions and the third stack of channel regions, and further wherein the second fin structure is between the second stack of channel regions and the fourth stack of channel regions.

18. The memory cell of claim 16, wherein the first nanostructure transistor and second nanostructure, respectively, have a higher drive current relative to the first fin-FET transistor and the second Fin-FET transistor, respectively.

19. The memory cell of claim 16, further comprising a fifth nanostructure transistor configured as a first read-pass transistor of the memory cell, and including an eleventh source/drain region, a twelfth source/drain region, a fifth stack of channel regions between the eleventh source/drain region and the twelfth source/drain region, and a fifth gate electrode, aligned with and spaced apart from the third gate electrode, interjacent individual channel regions of the fifth stack of channel regions; and
a sixth nanostructure transistor configured as a first read-pull-down transistor of the memory cell, and including the twelfth source/drain region, a thirteenth source/drain region, a sixth stack of channel regions between the twelfth source/drain region and the thirteenth source/drain region, and the second gate electrode, interjacent individual channel regions of the sixth stack of channel regions.

20. The memory cell of claim 19, further comprising a seventh nanostructure transistor configured as a first read-pull-down transistor of the memory cell, and including a fourteenth source/drain region, a fifteenth source/drain region, a seventh stack of channel regions between the fourteenth source/drain region and the fifteenth source/drain region, and the first gate electrode interjacent individual channel regions of the seventh stack of channel regions; and
an eighth nanostructure transistor configured as a second read-pass transistor of the memory cell, and including the fifteenth source/drain region, a sixteenth source/drain region, an eighth stack of channel regions between the fifteenth source/drain region and the sixteenth source/drain region, and a sixth gate electrode, aligned with and spaced apart from the fourth gate electrode, interjacent individual channel regions of the eighth stack of channel regions.

* * * * *